(12) United States Patent
Kim et al.

(10) Patent No.: US 12,125,775 B2
(45) Date of Patent: Oct. 22, 2024

(54) SEMICONDUCTOR PACKAGE AND METHOD FOR MANUFACTURING THE SAME

(71) Applicants: NEPES CO., LTD., Chungcheongbuk-do (KR); NEPES LAWEH CORPORATION, Chungcheongbuk-do (KR)

(72) Inventors: Byung Cheol Kim, Incheon (KR); Yong Tae Kwon, Chungcheongbuk-do (KR); Hyo Gi Jo, Chungcheongbuk-do (KR); Dong Hoon Oh, Chungcheongbuk-do (KR); Jae Cheon Lee, Chungcheongbuk-do (KR); Hyung Jin Shin, Chungcheongbuk-do (KR); Mary Maye Melgo Galimba, Cavite (PH)

(73) Assignees: NEPES CO., LTD., Chungcheongbuk-do (KR); NEPES LAWEH CORPORATION, Chungcheongbuk-do (KR)

( * ) Notice: Subject to any disclaimer, the term of this patent is extended or adjusted under 35 U.S.C. 154(b) by 252 days.

(21) Appl. No.: 17/524,685

(22) Filed: Nov. 11, 2021

(65) Prior Publication Data

US 2022/0165648 A1 May 26, 2022

(30) Foreign Application Priority Data

Nov. 11, 2020 (KR) .................. 10-2020-0150517
Nov. 23, 2020 (KR) .................. 10-2020-0158060
Nov. 4, 2021 (KR) .................. 10-2021-0150899

(51) Int. Cl.
*H01L 23/48* (2006.01)
*H01L 21/48* (2006.01)
(Continued)

(52) U.S. Cl.
CPC .... *H01L 23/49811* (2013.01); *H01L 21/4857* (2013.01); *H01L 21/56* (2013.01);
(Continued)

(58) Field of Classification Search
CPC ............... H01L 23/49811; H01L 21/56; H01L 24/16; H01L 2224/16225
See application file for complete search history.

(56) References Cited

U.S. PATENT DOCUMENTS 9,589,903 B2   3/2017   Chen et al.
9,589,936 B2   3/2017   Zhai et al.
(Continued)

FOREIGN PATENT DOCUMENTS

JP   2020101706   7/2020
KR   20160100230   8/2016
(Continued)

OTHER PUBLICATIONS

"Office Action of Taiwan Counterpart Application", issued on Sep. 20, 2022, with English translation thereof, p. 1-p. 10.
(Continued)

*Primary Examiner* — Nicholas J Tobergte
(74) *Attorney, Agent, or Firm* — JCIPRNET

(57) ABSTRACT

Disclosed is a semiconductor package including a semiconductor chip having a first surface adjacent to an active layer and a second surface opposite to the first surface; a conductive stud disposed on the first surface of the semiconductor chip and connected to the active layer; an adhesive layer disposed on the second surface of the semiconductor chip; a conductive post disposed outside the semiconductor chip; a first redistribution structure, which is on the first surface of the semiconductor chip and includes a first redistribution insulation layer supporting the conductive stud and the conductive post; a second redistribution structure, which is
(Continued)

on the second surface of the semiconductor chip and includes a second redistribution insulation layer disposed on the adhesive layer; and a first molding layer disposed on the first redistribution structure and surrounding the semiconductor chip, the adhesive layer, the conductive stud, and the conductive post.

12 Claims, 18 Drawing Sheets

(51) Int. Cl.
    *H01L 21/56*         (2006.01)
    *H01L 23/00*         (2006.01)
    *H01L 23/31*         (2006.01)
    *H01L 23/367*       (2006.01)
    *H01L 23/498*       (2006.01)

(52) U.S. Cl.
    CPC ........ *H01L 23/3128* (2013.01); *H01L 23/367* (2013.01); *H01L 23/49822* (2013.01); *H01L 23/49833* (2013.01); *H01L 23/562* (2013.01); *H01L 24/16* (2013.01); *H01L 24/73* (2013.01); *H01L 2224/16225* (2013.01); *H01L 2224/73253* (2013.01)

(56) References Cited

U.S. PATENT DOCUMENTS

| | | | |
|---|---|---|---|
| 9,601,471 | B2 | 3/2017 | Zhai et al. |
| 9,613,857 | B2 * | 4/2017 | Chen ................. H01L 21/76877 |
| 9,735,087 | B2 * | 8/2017 | Chang ............... H01L 23/49827 |
| 10,050,004 | B2 | 8/2018 | Scanlan et al. |
| 10,177,103 | B1 * | 1/2019 | Yi ........................... H01L 24/20 |
| 10,468,355 | B2 | 11/2019 | Wu et al. |
| 11,177,142 | B2 | 11/2021 | Huang et al. |
| 2011/0042821 | A1 * | 2/2011 | Kirby ................ H01L 21/76898 438/666 |
| 2016/0049383 | A1 | 2/2016 | Woychik et al. |
| 2016/0240465 | A1 | 8/2016 | Chen |
| 2016/0329299 | A1 * | 11/2016 | Lin ...................... H01L 23/5385 |
| 2016/0343695 | A1 * | 11/2016 | Lin ........................ H01L 23/528 |
| 2018/0076103 | A1 * | 3/2018 | Jeon .................... H01L 23/5385 |
| 2018/0076157 | A1 * | 3/2018 | Hsu .......................... H01L 21/56 |
| 2019/0333869 | A1 * | 10/2019 | Teng .................... H01L 21/4853 |
| 2020/0020643 | A1 * | 1/2020 | Yu ...................... H01L 23/49827 |
| 2020/0027852 | A1 * | 1/2020 | Chen ....................... H01L 24/82 |
| 2020/0144237 | A1 * | 5/2020 | Kang ................... H10N 10/817 |

FOREIGN PATENT DOCUMENTS

| | | |
|---|---|---|
| KR | 20160111308 | 9/2016 |
| KR | 20170048439 | 5/2017 |
| KR | 20170141733 | 12/2017 |
| KR | 20180084878 | 7/2018 |
| KR | 20190068469 | 6/2019 |
| KR | 20200050452 | 5/2020 |
| TW | 201413882 | 4/2014 |
| TW | 201618274 | 5/2016 |
| TW | 201715670 | 5/2017 |
| TW | 201907531 | 2/2019 |

OTHER PUBLICATIONS

Office Action of Korea Counterpart Application, Application No. 10-2021-0150898, with English translation thereof, issued on Dec. 1, 2022, pp. 1-15.

Office Action of Korea Counterpart Application, Application No. 10-2021-0150899, with English translation thereof, issued on Dec. 1, 2022, pp. 1-16.

\* cited by examiner

SEMICONDUCTOR PACKAGE AND METHOD FOR MANUFACTURING THE SAME

CROSS-REFERENCE TO RELATED APPLICATIONS

This application is based on and claims priority under 35 U.S.C. § 119 to Korean Patent Application Nos. 10-2020-0150517, filed on Nov. 11, 2020, 10-2020-0158060, filed on Nov. 23, 2020, and 10-2021-0150899, filed on Nov. 4, 2021, in the Korean Intellectual Property Office, the disclosures of which are incorporated by reference herein in their entirety.

BACKGROUND

1. Field

One or more embodiments relate to a semiconductor package and a method of manufacturing the same.

2. Description of the Related Art

The storage capacity of semiconductor chips is increased and, at the same time, semiconductor packages including semiconductor chips are demanded to be thin and light. Also, research is being conducted to include semiconductor chips of various functions in a semiconductor package and to quickly drive the semiconductor chips. In response to this trend, research is being conducted on package-on-package (PoP)-type semiconductor packages in which an upper semiconductor package is stacked on a lower semiconductor package.

SUMMARY

One or more embodiments include a thin and light semiconductor package.

One or more embodiments include a semiconductor package having a redistribution line pattern formed in a fine size.

One or more embodiments include a semiconductor package of which a warpage is reduced, thereby improving a structural reliability.

One or more embodiments include a semiconductor package with improved heat dissipation efficiency.

According to one or more embodiments, a semiconductor package includes a semiconductor chip having a first surface adjacent to an active layer and a second surface opposite to the first surface; a conductive stud disposed on the first surface of the semiconductor chip and connected to the active layer; an adhesive layer disposed on the second surface of the semiconductor chip; a conductive post disposed outside the semiconductor chip; a first redistribution structure, which is on the first surface of the semiconductor chip and includes a first redistribution insulation layer supporting the conductive stud and the conductive post; a first redistribution line pattern extending inside the first redistribution insulation layer in a horizontal direction; and a first redistribution via pattern extending inside the first redistribution insulation layer in a vertical direction; a second redistribution structure, which is on the second surface of the semiconductor chip and includes a second redistribution insulation layer disposed on the adhesive layer; a second redistribution line pattern extending inside the second redistribution insulation layer in a horizontal direction; and a second redistribution via pattern extending inside the second redistribution insulation layer in a vertical direction; and a first molding layer disposed on the first redistribution structure and surrounding the semiconductor chip, the adhesive layer, the conductive stud, and the conductive post.

According to an example embodiment, the conductive post may penetrate through the first molding layer in a vertical direction, and the second redistribution insulation layer of the second redistribution structure may surround at least a portion of the conductive post.

According to an example embodiment, a number of layers formed by the first redistribution line pattern of the first redistribution structure in a horizontal direction may be greater than a number of layers formed by the second redistribution line pattern of the second redistribution structure in the horizontal direction.

According to an example embodiment, one surface of the conductive post may contact the first redistribution via pattern of the first redistribution structure, and the other surface of the conductive post opposite to the one surface may contact the second redistribution line pattern of the second redistribution structure.

According to an example embodiment, the semiconductor package may further include a conductive pillar disposed on the second redistribution structure and connected to the second redistribution line pattern and the second redistribution via pattern of the second redistribution structure; and a second molding layer disposed on the second redistribution structure and surrounding a side surface of the conductive pillar.

According to an example embodiment, one surface of the second molding layer may be on the same plane as one surface of the conductive pillar.

According to an example embodiment, the semiconductor package may further include a package connection pad disposed on the conductive pillar, wherein the second molding layer may surround side surfaces of the package connection pad, and one surface of the second molding layer may be on the same plane as one surface of the package connection pad.

According to an example embodiment, a first vertex formed as a bottom surface and a side surface of the first redistribution structure meet may be disposed inside a second vertex formed as a top surface and the side surface of the first redistribution structure meet.

According to an example embodiment, sidewalls of the second redistribution structure may be surrounded by the first molding layer.

According to an example embodiment, a length of a first molding portion of the molding layer disposed between a top surface of the first redistribution structure and a bottom surface of the second redistribution structure in the vertical direction may be less than a length of a second molding portion disposed on the top surface of the first redistribution structure and surrounding side surfaces of the second redistribution structure in the vertical direction.

According to an example embodiment, the semiconductor package may further include a passive device disposed on the first redistribution structure.

According to an example embodiment, the second redistribution structure may be a printed circuit board (PCB).

According to one or more embodiments, a method of manufacturing a semiconductor package, the method includes forming a first redistribution structure; forming a conductive post on the first redistribution structure; mounting a semiconductor structure, in which an adhesive layer, a semiconductor chip, and a conductive stud are sequentially stacked, on the first redistribution structure; forming a first molding layer to surround the semiconductor structure; removing at least any one of a portion of the first molding layer, a portion of the conductive post, and a portion of the conductive stud, such that one surface of the conductive post and one surface of the conductive stud are exposed from the first molding layer; and forming a second redistribution structure connected to the conductive post and the conductive stud on the first molding layer.

According to an example embodiment, the method may further include forming a conductive pillar on a carrier substrate; forming a second molding layer on the carrier substrate; and removing at least any one of a portion of the second molding layer and a portion of the conductive pillar, such that one surface of the conductive pillar is exposed from the second molding layer, wherein the forming of the first redistribution structure includes forming the first redistribution structure on the second molding layer to be connected to the conductive pillar.

According to an example embodiment, the method may further include forming a package connection pad on the carrier substrate, wherein the forming of the conductive pillar on the carrier substrate may include forming the conductive pillar on one surface of the package connection pad.

According to an example embodiment, the method may further include, after mounting the semiconductor structure on the first redistribution structure, individualizing a first structure including the first redistribution structure, the conductive post, and the semiconductor structure; and disposing the first structure on the carrier substrate, wherein the forming of the first molding layer to surround the semiconductor structure may include forming the first molding layer to surround the first structure on the carrier substrate, and the method may further include removing the carrier substrate after the forming of the first molding layer.

Since one surface of an adhesive layer and one surface of a conductive post may be coplanar with one surface of a molding layer in a semiconductor package according to one or more embodiments, the semiconductor package may be thin and light.

Also, the semiconductor package according to one or more embodiments may include conductive studs and conductive posts connected to a redistribution line pattern, and thus the redistribution line pattern may be formed in a fine size.

Also, a semiconductor package according to one or more embodiments may include a conductive pillar mounted on a redistribution structure and a molding layer surrounding the conductive pillar, thereby reducing warpage of the semiconductor package. As a result, the structural reliability of the semiconductor package may be improved.

Also, a semiconductor package according to one or more embodiments may include the conductive pillar, thereby improving the heat dissipation efficiency of the semiconductor package.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
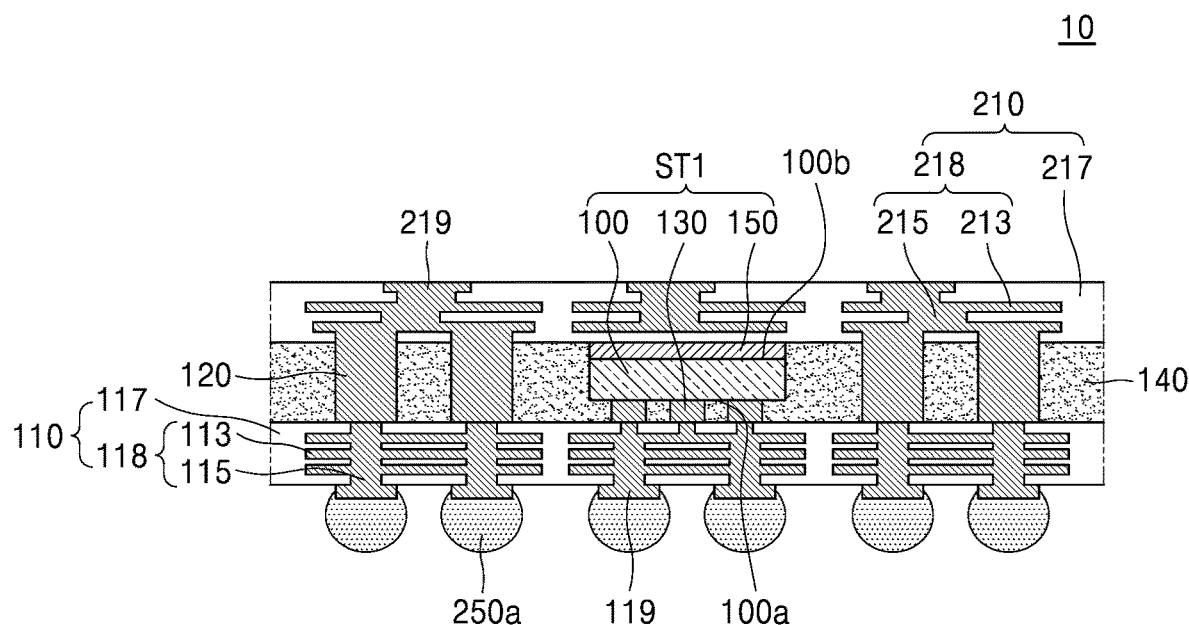
FIG. 1 is a cross-sectional view of a semiconductor package according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described in detail with reference to the accompanying drawings. However, one or more embodiments may be modified in various other forms, and the scope of the concept of one or more embodiments should not be construed as being limited by the embodiments described below. One or more embodiments are preferably interpreted as being provided to more fully explain the concepts of one or more embodiments to one of ordinary skill in the art. The same reference numerals denote the same elements throughout. Furthermore, various elements and regions in the drawings are schematically illustrated. Accordingly, the concept of one or more embodiments is not limited by relative sizes or spacing illustrated in the accompanying drawings.

While such terms as "first," "second," etc., may be used to describe various elements, such elements must not be limited to the above terms. The above terms may be used only to distinguish one element from another. For example, without departing from the scope of one or more embodiments, a first element may be referred to as a second element, and similarly, a second element may also be referred to as a first element.

The terms used in the present specification are merely used to describe particular embodiments, and are not intended to limit one or more embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used herein have the same meaning as commonly understood by one of ordinary skill in the art to which the concepts of one or more embodiments belong, including technical and scientific terms. Also, commonly used terms as defined in the dictionary should be construed as having a meaning consistent with their meaning in the context of the relevant technology, and unless explicitly defined herein, it will be understood that they shall not be construed in an overly formal sense.

One or more embodiments will be described in detail with reference to the accompanying drawings.

FIG. 1 is a cross-sectional view of a semiconductor package 10 according to an example embodiment of the inventive concept.

Referring to FIG. 1, the semiconductor package 10 according to one or more embodiments may function as a lower semiconductor package in a package-on-package (PoP)-type semiconductor package.

Also, the semiconductor package 10 may be a wafer level package (WLP). In an example embodiment, the semiconductor package 10 may be a fan-out wafer level package. For example, at least one of a plurality of external connection terminals 250a included in the semiconductor package 10 may be arranged outside a semiconductor chip 100. However, the semiconductor package 10 is not limited to a WLP and may be a panel level package.

The semiconductor package 10 according to one or more embodiments may include the semiconductor chip 100, a first redistribution structure 110, conductive posts 120, conductive studs 130, a molding layer 140, an adhesive layer 150, a second redistribution structure 210, and the external connection terminals 250a.

According to an example embodiment, the semiconductor chip 100 may have a first surface 100a and a second surface 100b. For example, the first surface 100a of the semiconductor chip 100 may be one surface of the semiconductor chip 100 in contact with the conductive stud 130, and the second surface 100b of the semiconductor chip 100 may be one surface of the semiconductor chip 100 opposite to the first surface 100a and in contact with the adhesive layer 150.

Hereinafter, a horizontal direction may be defined as a direction parallel to a direction in which the first surface 100a and the second surface 100b of the semiconductor chip 100 extend (e.g., the width-wise direction of the semiconductor chip 100), and a vertical direction may be defined as a direction perpendicular to the direction in which the first surface 100a and the second surface 100b of the semiconductor chip 100 extend (e.g., the thickness-wise direction of the semiconductor chip 100).

In an example embodiment, the semiconductor chip 100 may have an active layer at a portion adjacent to the first surface 100a. The active layer of the semiconductor chip 100 may include a plurality of individual devices of various types. For example, the individual devices may include various microelectronic devices, e.g., a complementary metal-oxide semiconductor (CMOS) transistor, a metal-oxide-semiconductor field effect transistor (MOSFET), a system large scale integration (LSI), an image sensor like a CMOS imaging sensor (CIS), a micro-electro-mechanical system (MEMS), an active device, a passive device, etc.

In an example embodiment, chip pads (not shown) electrically and respectively connected to the plurality of individual devices in the active layer may be arranged on the first surface 100a of the semiconductor chip 100. Also, as described below, the chip pads of the semiconductor chip 100 may be respectively connected to the conductive studs 130.

In an example embodiment, the first redistribution structure 110 may be disposed under the semiconductor chip 100. In other words, the first redistribution structure 110 may be disposed on the first surface 100a of the semiconductor chip 100.

In addition, the first redistribution structure 110 may include a first redistribution insulation layer 117 and a first redistribution pattern 118 extending inside the first redistribution insulation layer 117 and electrically connected to the conductive post 120 and the conductive stud 130.

A first redistribution line pattern 113 may extend in a horizontal direction inside the first redistribution insulation layer 117, and a first redistribution via pattern 115 may extend in a vertical direction inside the first redistribution insulation layer 117.

According to an example embodiment, a plurality of layers may be formed by the first redistribution line pattern 113 extending in the horizontal direction inside the first redistribution insulation layer 117. For example, a number of layers formed by the first redistribution line pattern 113 may be from 3 to 7 layers. However, one or more embodiments are not limited thereto, and a single layer may be formed by the first redistribution line pattern 113.

In an example embodiment, the first redistribution via pattern 115 may interconnect the plurality of first redistribution line patterns 113, interconnect the first redistribution line pattern 113 to the conductive post 120, interconnect the first redistribution line pattern 113 to the conductive stud 130, or interconnect the first redistribution line pattern 113 to a first conductive pad 119.

In an example embodiment, the first redistribution insulation layer 117 may include an insulation material made of a photo imageable dielectric (PID) material with which a photolithography process may be performed. For example, the first redistribution insulation layer 117 may include photosensitive polyimide (PSPI). However, one or more embodiments are not limited thereto, and the first redistribution insulation layer 117 may include an oxide or a nitride. For example, the first redistribution insulation layer 117 may include silicon oxide or silicon nitride.

In an example embodiment, materials constituting the first redistribution via patterns 115 and the first redistribution line patterns 113 may include copper (Cu). However, one or more embodiments are not limited thereto, and the materials constituting the first redistribution via patterns 115 and the first redistribution line patterns 113 may include metals like nickel (Ni), gold (Au), silver (Ag), aluminum (Al), tungsten (W), and titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru) or an alloy thereof.

In an example embodiment, the first redistribution line patterns 113 and the first redistribution via patterns 115 may be electrically connected to the conductive posts 120 and the conductive studs 130.

In an example embodiment, an interval between a plurality of first redistribution line patterns 113 may be about 10 micrometers or less. For example, the interval between the plurality of first redistribution line patterns 113 in the horizontal direction may be from about 1 micrometer to about 3 micrometers. Also, the interval between the plurality of first redistribution line patterns 113 in the horizontal direction may be from about 3 micrometer to about 5 micrometers. However, the interval between the plurality of first redistribution line patterns 113 is not limited thereto.

In an example embodiment, the first conductive pad 119 may contact the first redistribution via pattern 115. Also, at least a portion of a side surface of the first conductive pad 119 may be surrounded by the first redistribution insulation layer 117. However, one or more embodiments are not limited thereto, and the side surface of the first conductive pad 119 may not be surrounded by the first redistribution insulation layer 117.

In an example embodiment, one surface of the first conductive pad 119 may be in contact with an external connection terminal 250a, and the other surface of the first conductive pad 119 opposite to the one surface may be in contact with the first redistribution via pattern 115. In other words, the first conductive pad 119 may electrically connect the external connection terminal 250a, the first redistribution line pattern 113, and the first redistribution via pattern 115 to one another.

In an example embodiment, the conductive posts 120 may be posts of a conductive material that penetrate through the molding layer 140 in the vertical direction. For example, the conductive posts 120 may be arranged in a shape surrounding the side surface of the semiconductor chip 100.

In an example embodiment, the length of the conductive post 120 in the vertical direction may be greater than the length of the semiconductor chip 100 in the vertical direction. Also, the length of the conductive post 120 in the vertical direction may be greater than the length of the molding layer 140 in the vertical direction.

In an example embodiment, the bottom surface of the conductive post 120 may contact the first redistribution via pattern 115 of the first redistribution structure 110. Also, the top surface of the conductive post 120 may contact a second redistribution line pattern 213 of the second redistribution structure 210.

Also, at least a portion of the conductive post 120 may be surrounded by a second redistribution insulation layer 217 of the second redistribution structure 210. Also, the bottom surface of the conductive post 120 may be on the same plane as the top surface of the first redistribution structure 110, and the top surface of the conductive post 120 may be at a higher level than the bottom surface of the second redistribution structure 210.

In an example embodiment, the conductive posts 120 may be arranged on the first redistribution structure 110 in a zigzag shape. However, the arrangement structure of the conductive posts 120 is not limited thereto.

Also, in an example embodiment, the conductive post 120 may have a cylindrical shape or a polygonal column-like shape.

In an example embodiment, a material constituting the conductive posts 120 may include Cu. However, the material constituting the conductive posts 120 is not limited thereto, and the material constituting the conductive posts 120 may include metals like Ni, Au, Ag, Al, W, Ti, Ta, In, Mo, Mn, Co, Sn, Mg, Re, Be, Ga, and Ru, or an alloy thereof.

In an example embodiment, the conductive stud 130 may be a conductive material disposed between the semiconductor chip 100 and the first redistribution structure 110. For example, the conductive studs 130 may have a cylindrical shape or a polygonal column-like shape.

In an example embodiment, the conductive studs 130 may be arranged between the semiconductor chip 100 and the first redistribution structure 110 and electrically connect a plurality of individual devices in the active layer of the semiconductor chip 100 to the first redistribution line pattern 113 and the first redistribution via pattern 115.

In an example embodiment, the conductive studs 130 may contact chip pads (not shown) of the semiconductor chip 100. Also, the length of the conductive studs 130 in the vertical direction may be less than the length of the conductive posts 120 in the vertical direction.

Also, a material constituting the conductive studs 130 may include Cu. However, the material constituting the conductive studs 130 is not limited thereto, and the material constituting the conductive posts 120 may include metals like Ni, Au, Ag, Al, W, Ti, Ta, In, Mo, Mn, Co, Sn, Mg, Re, Be, Ga, and Ru, or an alloy thereof.

In an example embodiment, the second redistribution structure 210 may be disposed under a semiconductor chip 100. For example, the second redistribution structure 210 may be disposed on the second surface 100b of the semiconductor chip 100.

In addition, the second redistribution structure 210 may include the second redistribution insulation layer 217 and a second redistribution pattern 218 extending inside the second redistribution insulation layer 217 and electrically connected to the conductive post 120 and the conductive stud 130.

A second redistribution line pattern 213 may extend in a horizontal direction inside the second redistribution insulation layer 217, and a second redistribution via pattern 215 may extend in a vertical direction inside the second redistribution insulation layer 217.

According to an example embodiment, a plurality of layers may be formed by the second redistribution line pattern 213 extending in the horizontal direction inside the second redistribution insulation layer 217. For example, a number of layers formed by the second redistribution line pattern 213 may be from 3 to 7 layers. However, one or more embodiments are not limited thereto, and a single layer may be formed by the second redistribution line pattern 213.

Also, the number of layers formed by the second redistribution line pattern 213 extending in the horizontal direction inside the second redistribution insulation layer 217 may be less than the number of layers formed by the first redistribution line pattern 113 extending in the horizontal direction inside the first redistribution line pattern 113.

In an example embodiment, a portion of the second redistribution line pattern 213 may contact the conductive post 120. Also, the second redistribution via pattern 215 may connect a plurality of second redistribution line patterns 213 to one another or connect the second redistribution line pattern 213 and a second conductive pad 219 to each other.

In an example embodiment, the second redistribution insulation layer 217 may include an insulation material including a PID material applicable to a photolithography process. For example, the second redistribution insulation layer 217 may include PSPI. However, one or more embodiments are not limited thereto, and the second redistribution insulation layer 217 may include an oxide or a nitride. For example, the second redistribution insulation layer 217 may include silicon oxide or silicon nitride.

In an example embodiment, materials constituting the second redistribution via patterns 215 and the second redistribution line patterns 213 may include copper (Cu). However, one or more embodiments are not limited thereto, and the materials constituting the second redistribution via patterns 215 and the second redistribution line patterns 213 may include metals like nickel (Ni), gold (Au), silver (Ag), aluminum (Al), tungsten (W), and titanium. (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru) or an alloy thereof.

In an example embodiment, the second redistribution line patterns 213 and the second redistribution via patterns 215 may be electrically connected to the conductive posts 120 and the conductive studs 130.

In an example embodiment, an interval between the plurality of second redistribution line patterns 213 may be about 10 micrometers or less. For example, the interval between the plurality of second redistribution line patterns 213 in the horizontal direction may be from about 1 micrometer to about 3 micrometers. Also, the interval between the plurality of second redistribution line patterns 213 in the horizontal direction may be from about 3 micrometer to about 5 micrometers. However, the interval between the plurality of second redistribution line patterns 213 is not limited thereto.

In an example embodiment, the second conductive pad 219 may contact the second redistribution via pattern 215. Also, at least a portion of a side surface of the second conductive pad 219 may be surrounded by the second redistribution insulation layer 217. However, one or more embodiments are not limited thereto, and the side surface of the second conductive pad 219 may not be surrounded by the second redistribution insulation layer 217.

In an example embodiment, one surface of the second conductive pad 219 may contact a package connection terminal (not shown) of a separate semiconductor package (not shown) mounted on the semiconductor package 10 of the present disclosure, and the other surface of the second conductive pad 219 opposite to the one surface may contact the second redistribution via pattern 215.

In an example embodiment, the molding layer 140 may be disposed between the first redistribution structure 110 and the second redistribution structure 210 and surround the semiconductor chip 100, the conductive posts 120, the conductive studs 130, and the adhesive layer 150. For example, the molding layer 140 may be configured to fix the semiconductor chip 100, the conductive posts 120, and the conductive studs 130 onto the first redistribution structure 110.

In an example embodiment, the molding layer 140 may form the exterior of the semiconductor package 10 together with the first redistribution structure 110 and the second redistribution structure 210. For example, side surfaces of the molding layer 140, side surfaces of the first redistribution structure 110, and side surfaces of the second redistribution structure 210 may form side surfaces of the semiconductor package 10. Also, the side surfaces of the first redistribution structure 110, the side surfaces of the second redistribution structure 210, and the side surfaces of the molding layer 140 may be on the same planes.

In an example embodiment, the molding layer 140 may include an epoxy molding compound (EMC). However, the material constituting the molding layer 140 is not limited to the above-stated EMC and may also include various materials, e.g., an epoxy-based material, a thermosetting material, a thermoplastic material, a UV treatment material, etc.

In an example embodiment, the adhesive layer 150 may be attached on the top surface of the semiconductor chip 100. For example, the adhesive layer 150 may be a die attach film (DAF). However, the type of the adhesive layer 150 is not limited thereto.

In an example embodiment, one surface of the adhesive layer 150 may be coplanar with one surface of the molding layer 140. For example, the bottom surface of the adhesive layer 150 may be in contact with the second surface 100*b* of the semiconductor chip 100, side surfaces of the adhesive layer 150 may be surrounded by the molding layer 140, and the top surface of the adhesive layer 150 may be coplanar with the top surface of the molding layer 140.

Also, side surfaces of the adhesive layer 150 may be coplanar as side surfaces of the semiconductor chip 100.

In an example embodiment, the top surface of the adhesive layer 150, the top surface of the molding layer 140, and the bottom surface of the second redistribution structure 210 may be on the same plane as each other.

In an example embodiment, the color of the adhesive layer 150 may be substantially the same as the color of the molding layer 140. For example, both the color of the adhesive layer 150 and the color of the molding layer 140 may be black. However, the color of the adhesive layer 150 and the color of the molding layer 140 are not limited thereto.

For example, when the color of the adhesive layer 150 and the color of the molding layer 140 are the same, the interface between the adhesive layer 150 and the molding layer 140 may not be observed.

In an example embodiment, the adhesive layer 150 may include a marking region including at least any one of information regarding type, number, performance, name and/or logo of a manufacturing company, manufactured date, and serial number on the top surface of the adhesive layer 150. For example, an ink marking technique or a laser marking technique may be used for marking information on the semiconductor package 10.

In an example embodiment, the external connection terminal 250*a* may be attached to the bottom surface of the first redistribution structure 110 and may be a connection terminal for electrical connection between the semiconductor chip 100 and an external device.

In an example embodiment, the external connection terminal 250*a* may be attached to the bottom surface of the first conductive pad 119. Also, the external connection terminal 250*a* may be a solder ball containing a metal material including at least one material from among Sn, Ag, Cu, and Al.

In an example embodiment, at least any one of the external connecting terminals 250*a* may be disposed outside the side surfaces of the semiconductor chip 100. Therefore, the semiconductor package 10 may be a semiconductor package having a fan-out structure.

Because the top surface of the adhesive layer 150 and the top surface of the molding layer 140 of the semiconductor package 10 according to one or more embodiments may be on the same plane, the semiconductor package 10 may be thin and light. Also, because the second redistribution insulation layer 217 of the second redistribution structure 210 of the semiconductor package 10 may cover at least a portion of the conductive post 120, the semiconductor package 10 may be thin and light.

Also, because the semiconductor package 10 according to one or more embodiments may include the conductive studs 130 and the conductive posts 120, the first redistribution line pattern 113 and the first redistribution via pattern 115 of the first redistribution structure 110 and the second redistribution line pattern 213 and the second redistribution via pattern 215 of the second redistribution structure 210 may be provided in fine sizes.

Also, because the semiconductor package 10 according to one or more embodiments may include the adhesive layer 150 disposed on the semiconductor chip 100, the structural reliability of the semiconductor package 10 may be improved.

Figure 2:
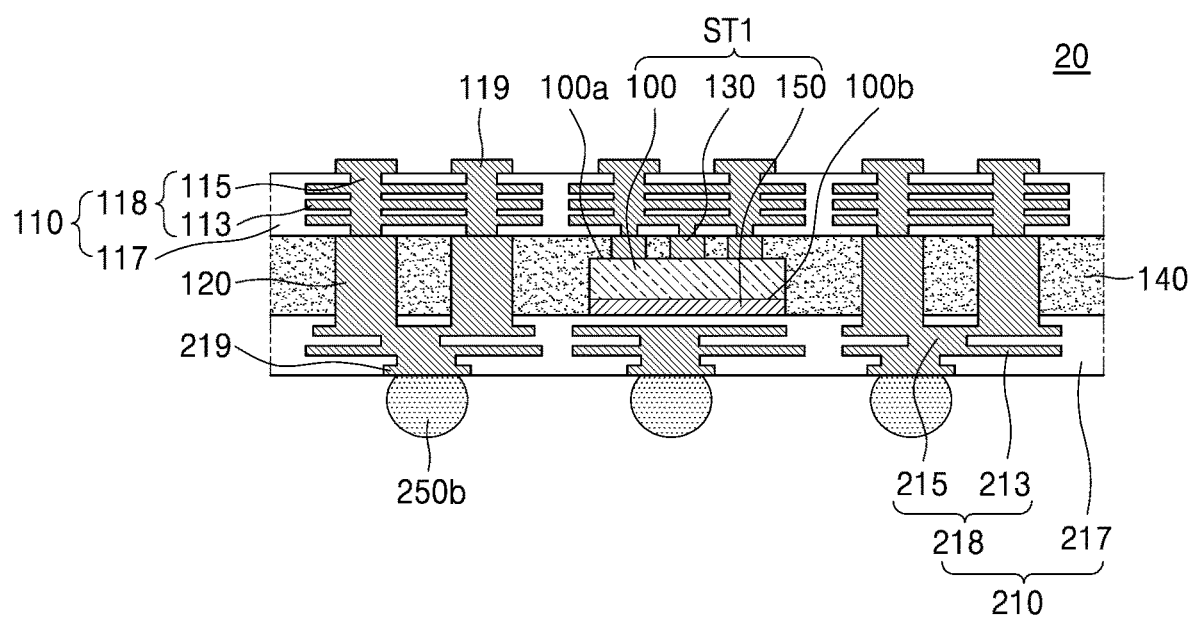
FIG. 2 is a cross-sectional view of a semiconductor package according to one or more embodiments.

FIG. 2 is a cross-sectional view of a semiconductor package 20 according to one or more embodiments.

Referring to FIG. 2, the semiconductor package 20 according to one or more embodiments may include the semiconductor chip 100, a first redistribution structure 110, conductive posts 120, conductive studs 130, a molding layer 140, an adhesive layer 150, a second redistribution structure 210, and external connection terminals 250b.

Hereinafter, descriptions of the semiconductor package 20 of FIG. 2 identical to the descriptions of the semiconductor package 10 of FIG. 1 given above will be omitted, and descriptions below will mainly focus on differences therebetween.

The semiconductor package 20 of FIG. 2 may have a structure corresponding to that of the semiconductor package 10 of FIG. 1 rotated by 180 degrees. In other words, the semiconductor package 20 of FIG. 2 may correspond to the structure of the semiconductor package 10 of FIG. 1 that is turned upside down.

In detail, in the semiconductor package 10 of FIG. 1, the first redistribution structure 110 may be disposed below the semiconductor chip 100, and the second redistribution structure 210 may be disposed above the semiconductor chip 100. However, in the semiconductor package 20 of FIG. 1, the first redistribution structure 110 may be disposed above the semiconductor chip 100, and the second redistribution structure 210 may be disposed below the semiconductor chip 100.

In an example embodiment, an external connection terminal 250b may be mounted on the second conductive pad 219. In other words, the external connection terminal 250b may be electrically connected to the second redistribution line pattern 213 and the second redistribution via pattern 215 of the second redistribution structure 210 through the second conductive pad 219.

Figure 3:
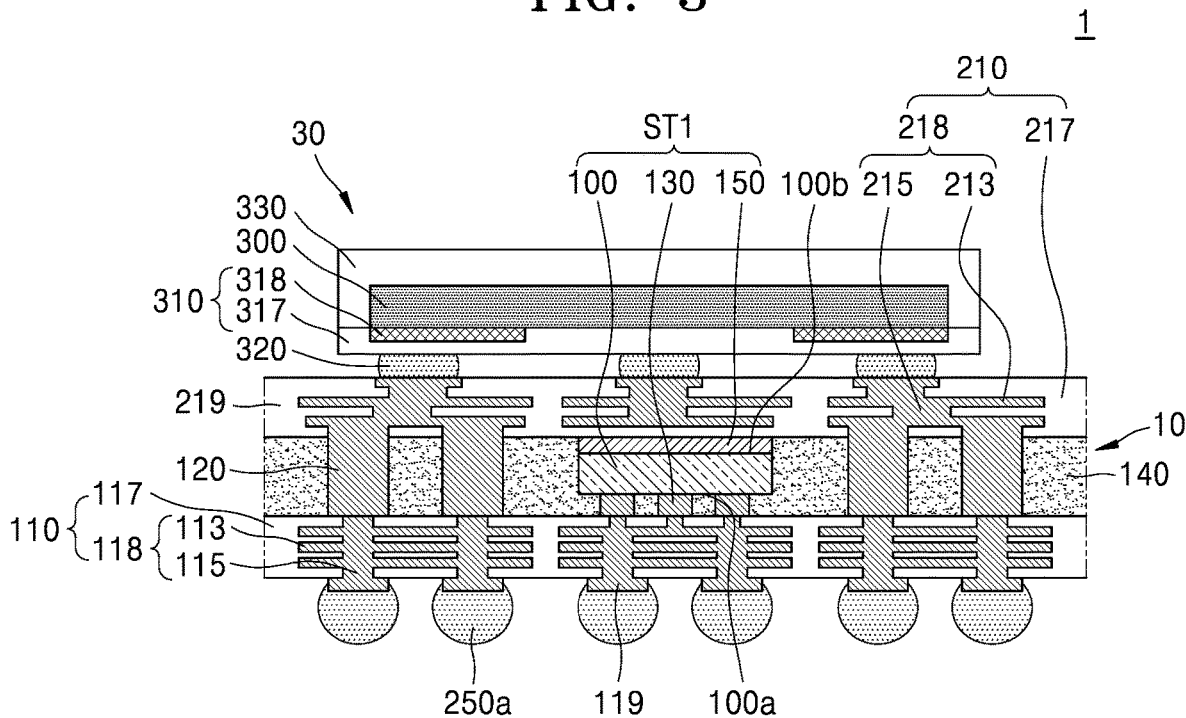
FIG. 3 is a cross-sectional view of a semiconductor package according to one or more embodiments.

FIG. 3 is a cross-sectional view of a semiconductor package 1 according to one or more embodiments.

The semiconductor package 1 of FIG. 3 may be a PoP-type semiconductor package in which an upper semiconductor package 30 is mounted on the semiconductor package 10. Since descriptions related to the semiconductor package 10 are identical to the descriptions given above with reference to FIG. 1, detailed descriptions thereof will be omitted.

The upper semiconductor package 30 may include a semiconductor chip 300, a wiring layer 310, a package connection terminal 320, and a molding layer 330.

In an example embodiment, the semiconductor chip 300 of the upper semiconductor package 30 may be a semiconductor chip of the same type as the semiconductor chip 100 of the semiconductor package 10. However, one or more embodiments are not limited thereto, and the semiconductor chip 300 of the upper semiconductor package 30 may be a semiconductor chip of a different type from the semiconductor chip 100 of the semiconductor package 10.

In example embodiments, the semiconductor package 1 may be a system in package (SIP) in which different types of semiconductor chips 100 and 300 and various electronic components are electrically connected to one another and operate as one system.

In an example embodiment, the wiring layer 310 may include a wiring pattern 318 electrically connected to a plurality of individual devices in an active layer of the semiconductor chip 300 and a wiring insulation layer 317 surrounding the wiring pattern 318.

In an example embodiment, the wiring layer 310 may be a redistribution structure including a redistribution pattern and a redistribution insulation layer surrounding the redistribution pattern. However, one or more embodiments are not limited thereto, and the wiring layer 310 may include a printed circuit board (PCB).

The package connection terminal 320 may be a terminal for interconnecting the semiconductor package 10 to the upper semiconductor package 30. In an example embodiment, the package connection terminal 320 may be disposed between the second redistribution structure 210 of the semiconductor package 10 and the wiring layer 310 of the upper semiconductor package 30.

The molding layer 330 may be mounted on the wiring layer 310 and surround the semiconductor chip 300. For example, the molding layer 330 may include an EMC-based material. However, the material constituting the molding layer 330 is not limited to the above-stated EMC and may also include various materials, e.g., an epoxy-based material, a thermosetting material, a thermoplastic material, a UV treatment material, etc.

Figure 4:
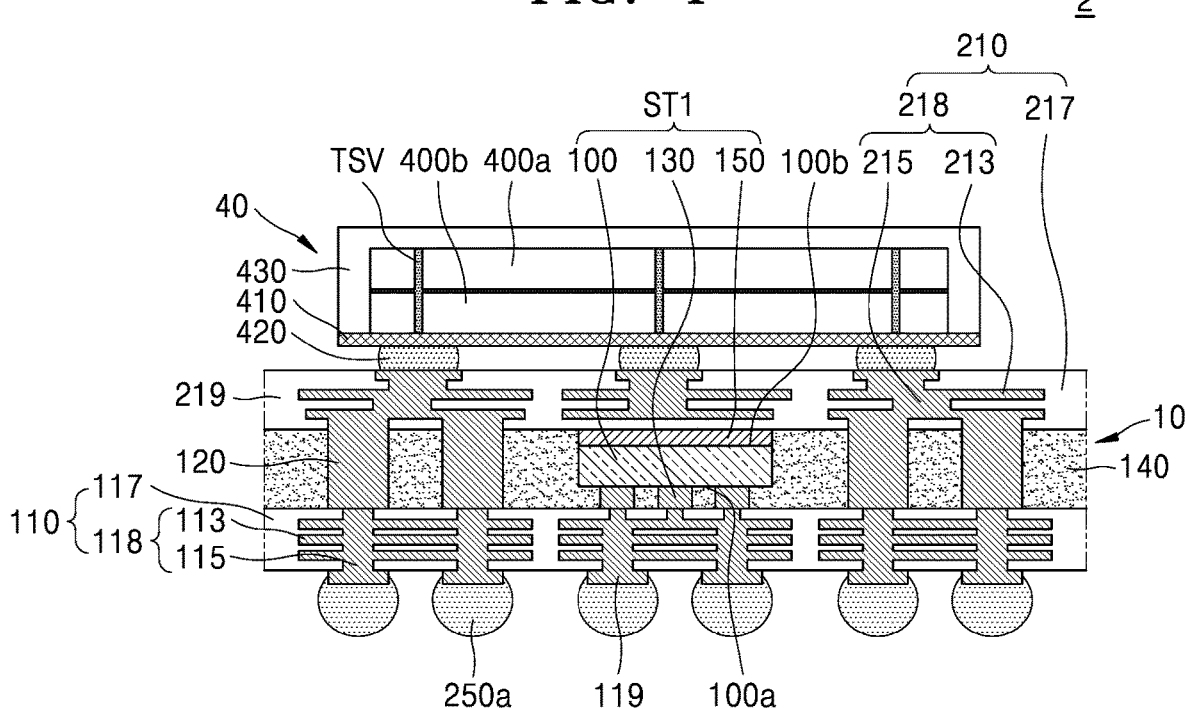
FIG. 4 is a cross-sectional view of a semiconductor package according to according to an example embodiment of the inventive concept.

FIG. 4 is a cross-sectional view of a semiconductor package 2 according to one or more embodiments.

The semiconductor package 2 of FIG. 4 may be a PoP-type semiconductor package in which an upper semiconductor package 40 is mounted on the semiconductor package 10. Since descriptions related to the semiconductor package 10 are identical to the descriptions given above with reference to FIG. 1, detailed descriptions thereof will be omitted.

The upper semiconductor package 40 may include a plurality of semiconductor chips 400a and 400b, a wiring layer 410, a package connection terminal 420, and a molding layer 430. Hereinafter, descriptions of the semiconductor package 40 of FIG. 4 identical to the descriptions of the semiconductor package 30 of FIG. 3 given above will be omitted, and descriptions below will mainly focus on differences therebetween.

The plurality of semiconductor chips 400a and 400b may be stacked in a vertical direction. For example, each of the plurality of semiconductor chips 400a and 400b may each include an active layer including a plurality of individual devices.

Also, the plurality of semiconductor chips 400a and 400b may include through electrodes TSVs penetrating through at least portions of the plurality of semiconductor chips 400a and 400b in a vertical direction. Active layers of the plurality of semiconductor chips 400a and 400b may be electrically connected to each other through the through electrodes TSV.

However, one or more embodiments are not limited thereto, and the plurality of semiconductor chips 400a and 400b may be electrically connected to each other through wire bonding.

Figure 5:
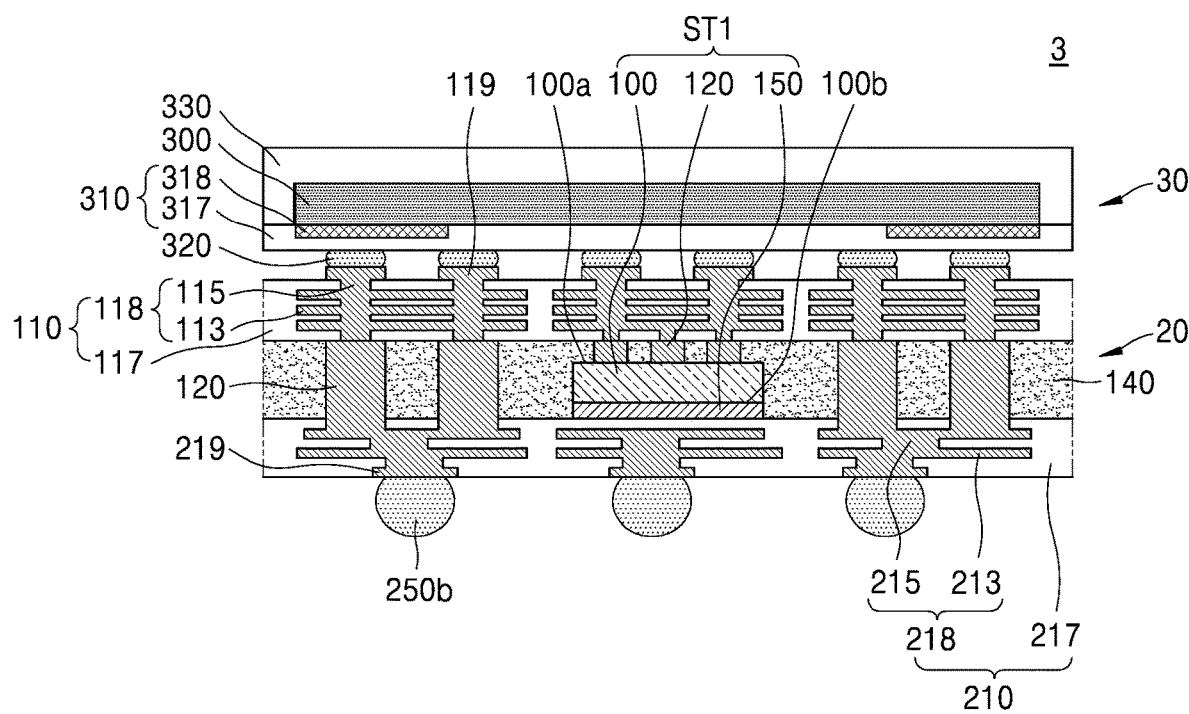
FIG. 5 is a cross-sectional view of a semiconductor package according to one or more embodiments.

FIG. 5 is a cross-sectional view of a semiconductor package 3 according to one or more embodiments.

The semiconductor package 3 of FIG. 5 may be a PoP-type semiconductor package in which the upper semiconductor package 30 is mounted on the semiconductor package 20. Since descriptions related to the semiconductor package 20 are identical to the descriptions given above with reference to FIG. 2 and descriptions related to the upper semiconductor package 30 are identical to the descriptions given above with reference to FIG. 3, detailed descriptions thereof will be omitted.

In an example embodiment, the package connection terminal 320 of the upper semiconductor package 30 may be disposed between the first redistribution structure 110 of the semiconductor package 20 and the wiring layer 310 of the upper semiconductor package 30.

FIGS. 6A to 6L are diagrams showing operations of the method of manufacturing the semiconductor package 10 according to one or more embodiments, respectively.

Hereinafter, a method of manufacturing the semiconductor package 10 according to one or more embodiments will be described with reference to FIGS. 6A to 6K. In detail, a method of manufacturing a semiconductor package according to according to one or more embodiments may be a method of manufacturing the semiconductor package 10 of FIG. 1.

Figure 6A:
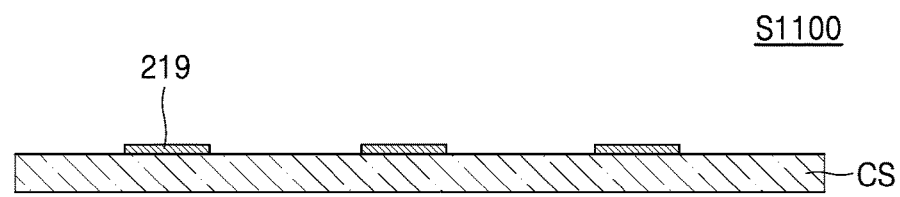
FIGS. 6A to 6K are diagrams showing operations of the method of manufacturing a semiconductor package according to one or more embodiments, respectively.
Figure 6B:
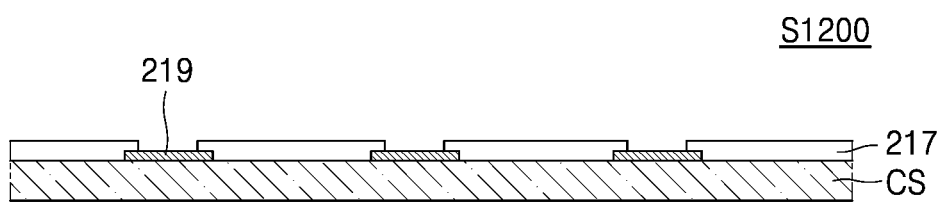

Referring to FIG. 6A, the method of manufacturing the semiconductor package 10 according to one or more embodiments may include operation S1100 of forming the second conductive pad 219 on a carrier substrate CS.

In an example embodiment, the carrier substrate CS may include various materials, such as a wafer, a glass substrate, a PCB, an EMC, a glass flex substrate (GFS), ceramic, epoxy, PI, Basalt, etc. However, the material constituting the carrier substrate CS is not limited thereto.

In an example embodiment, the shape of the carrier substrate CS may be a substrate having a circular or polygonal (e.g., triangular, rectangular, pentagonal, hexagonal, etc.) shape. However, the shape of the carrier substrate CS is not limited thereto. For example, the carrier substrate CS may be a circular plate or a polygonal plate having a width from about 200 mm to about 600 mm.

Referring to FIG. 6A, the method of manufacturing the semiconductor package 10 according to one or more embodiments may include operation S1200 of forming the second redistribution insulation layer 217 on the carrier substrate CS and patterning the second redistribution insulation layer 217.

In an example embodiment, the formation of the second redistribution insulation layer 217 may be performed through a spin coating process, and the patterning of the second redistribution insulation layer 217 may be performed through a photolithography process, an etching process, etc.

In an example embodiment, in operation S1200, the second redistribution insulation layer 217 may expose at least a portion of the second conductive pad 219.

Figure 6C:
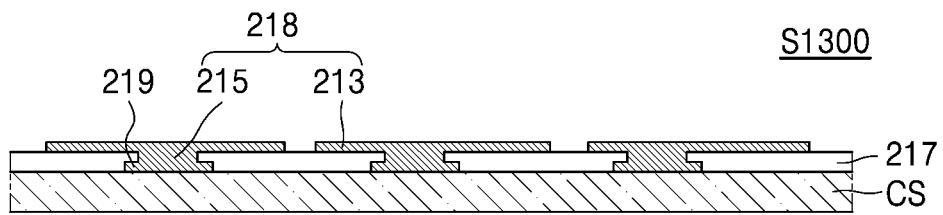

Referring to FIG. 6C, the method of manufacturing the semiconductor package 10 according to one or more embodiments may include operation S1300 of forming the second redistribution line pattern 213 and the second redistribution via pattern 215.

In an example embodiment, operation S1300 of forming the second redistribution line pattern 213 and the second redistribution via pattern 215 may include forming a seed layer (not shown) and forming the second redistribution line pattern 213 and the second redistribution via pattern 215 through a plating process using the seed layer.

Figure 6D:
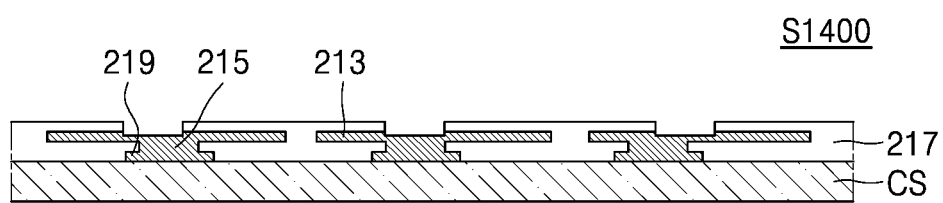
Figure 6E:
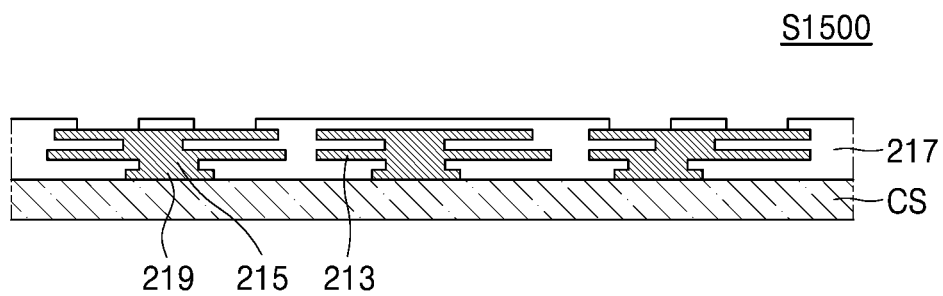

Referring to FIGS. 6D and 6E together, the method of manufacturing the semiconductor package 10 according to one or more embodiments may further include operation S1400 of forming the second redistribution insulation layer 217 and operation S1500 of forming the second redistribution line pattern 213 and the second redistribution via pattern 215.

In an example embodiment, when operations S1400 and S1500 are performed, the second redistribution line pattern 213 of the second redistribution structure 210 may form a plurality of layers extending in a horizontal direction.

However, when operations S1400 and S1500 are omitted in the method of manufacturing the semiconductor package 10 according to one or more embodiments, the second redistribution line pattern 213 of the second redistribution structure 210 may form a single layer extending in a horizontal direction.

Also, in operation S1500, the second redistribution insulation layer 217 may expose at least a portion of the second redistribution line pattern 213. The portion of the second redistribution line pattern 213 exposed by the second redistribution insulation layer 217 may be connected to the conductive post 120 to be described later.

Figure 6F:
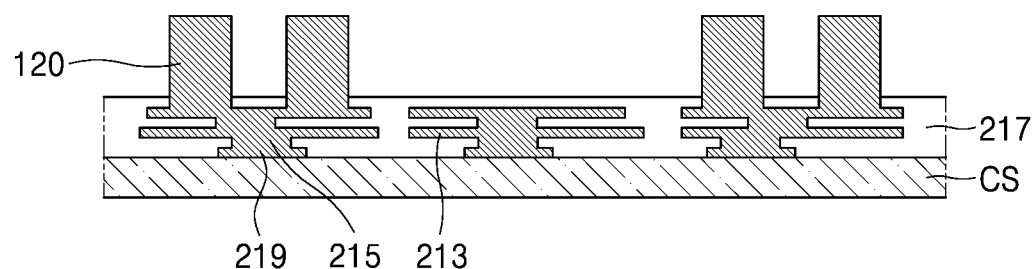

Referring to FIG. 6F, the method of manufacturing the semiconductor package 10 according to one or more embodiments may include operation S1600 of forming the conductive post 120 on the second redistribution structure 210.

In an example embodiment, the conductive post 120 may contact a portion of the second redistribution line pattern 213 of the second redistribution structure 210. Also, at least a portion of the conductive post 120 may be surrounded by a second redistribution insulation layer 217 of the second redistribution structure 210. Therefore, the structural reliability of the conductive post 120 may be improved.

Figure 6G:
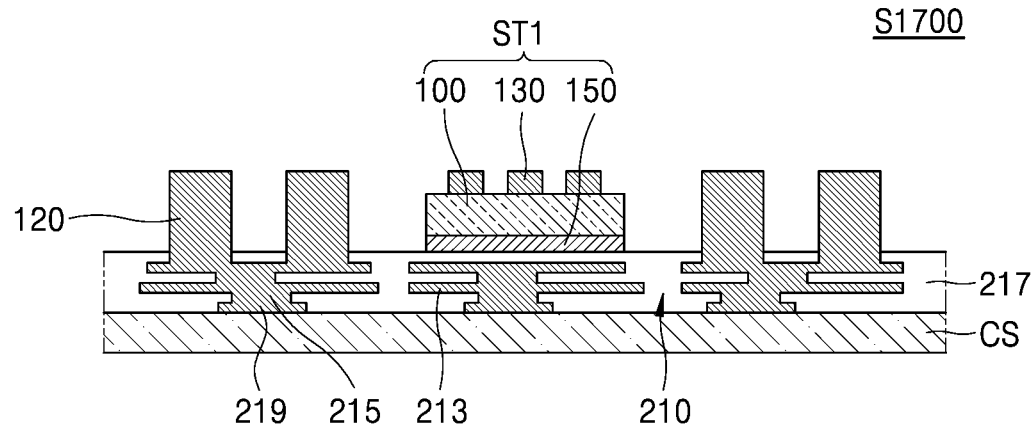

Referring to FIG. 6G, the method of manufacturing a semiconductor package 10 according to one or more embodiments may include operation S1700 of mounting a semiconductor structure ST1, in which the adhesive layer 150, the semiconductor chip 100, and the conductive stud 130 are sequentially stacked, on the second redistribution structure 210.

In an example embodiment, in operation S1700, the first semiconductor structure ST1 may be firmly attached onto the top surface of the second redistribution structure 210 by the adhesive layer 150.

After operation S1700 is performed, at least a portion of the carrier substrate CS may be removed, such that the carrier substrate CS has a certain vertical length. For example, at least a portion of the carrier substrate CS may be ground.

Also, after at least a portion of the carrier substrate CS is ground, the structure of operation S1700 may be individualized. Also, before performing operation S1800, the individualized structure of operation S1700 may be arranged on a separate carrier substrate (not shown). Also, the individualized structure of operation S1700 arranged on the separate carrier substrate (not shown) may be molded by the molding layer 140 by performing operation S1800.

Figure 6H:
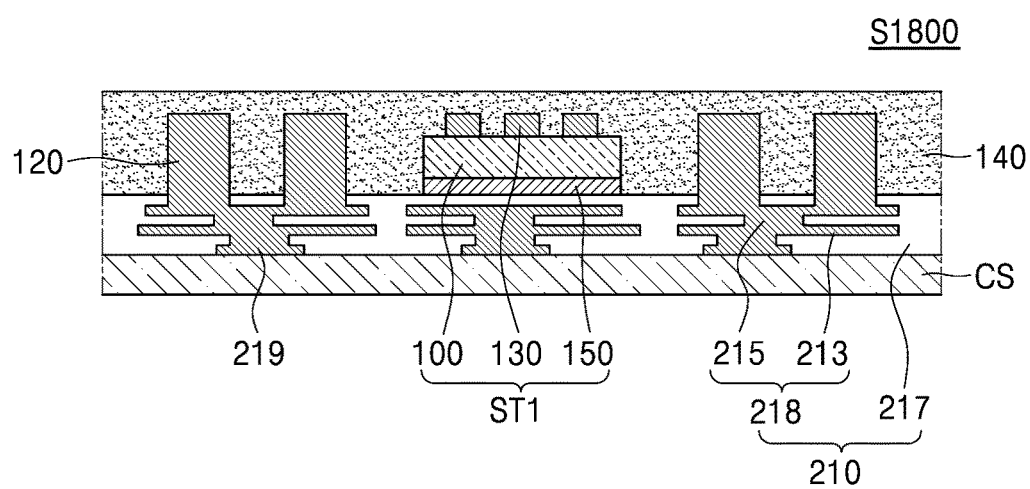

Referring to FIG. 6H, the method of manufacturing the semiconductor package 10 according to one or more embodiments may include operation S1800 of forming the molding layer 140 on the second redistribution structure 210.

In an example embodiment, the molding layer 140 may surround the first semiconductor structure ST1 and the conductive post 120 on the second redistribution structure 210. For example, the material constituting the molding layer 140 may include an EMC. However, the material constituting the molding layer 140 is not limited to the above-stated EMC and may also include an epoxy-based material, a thermosetting material, a thermoplastic material, a UV treatment material, etc.

Figure 6I:
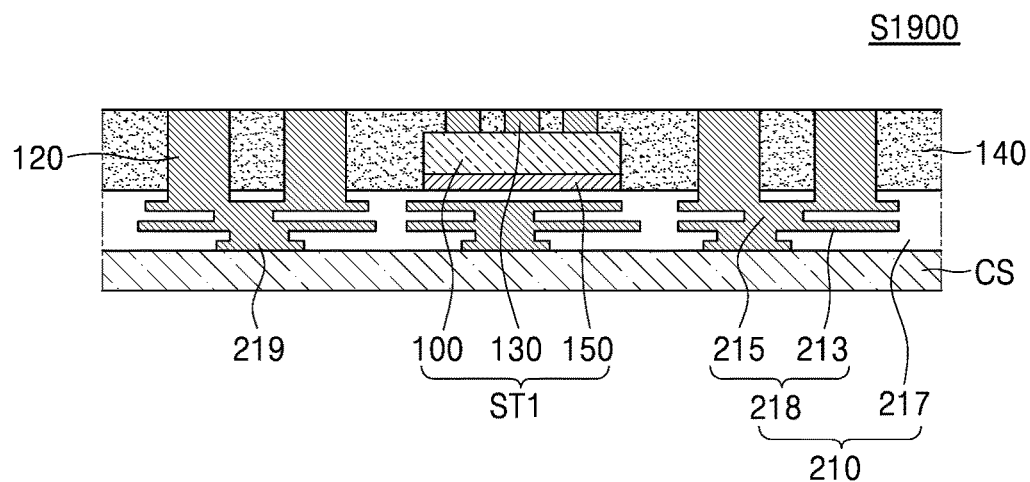

Referring to FIG. 6I, the method of manufacturing the semiconductor package 10 according to one or more embodiments may include operation S1900 of removing at least any one of a portion of the molding layer 140, a portion of the conductive post 120, and a portion of the conductive stud 130 so that one surface of the conductive post 120 and one surface of the conductive stud 130 of the first semiconductor structure ST1 are exposed through the molding layer 140.

In an example embodiment, the molding layer 140 may be removed through a grinding process. For example, at least a portion of the molding layer 140 may be removed so that one surface of the molding layer 140, one surface of the conductive post 120, and one surface of the conductive stud 130 become coplanar with one another.

Figure 6J:
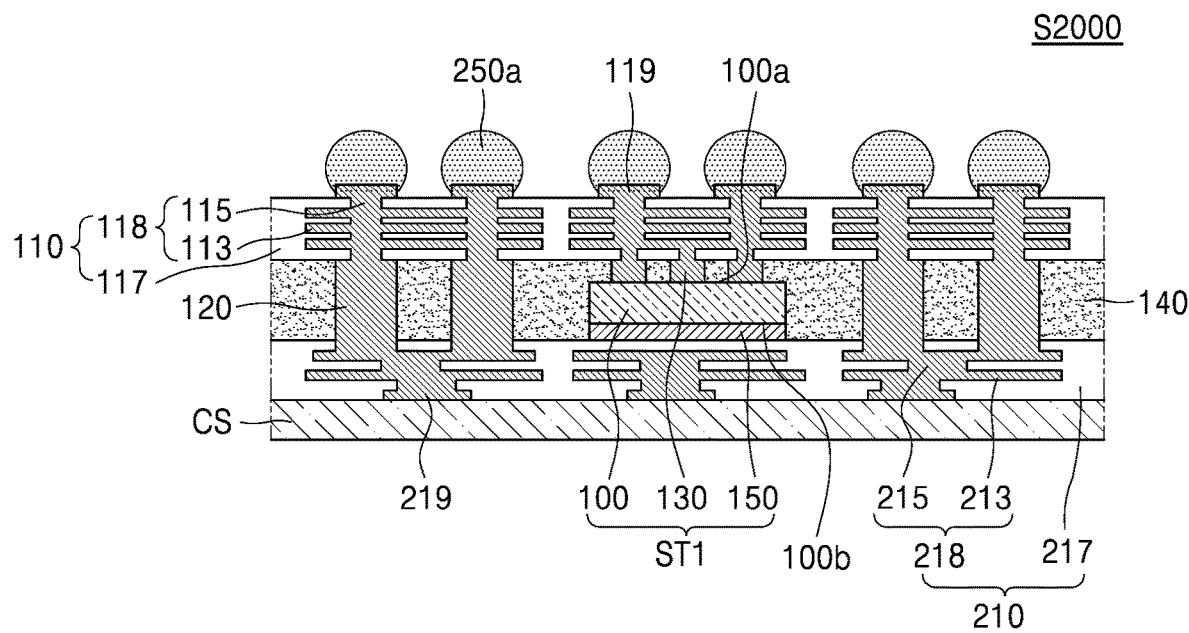
Figure 6K:
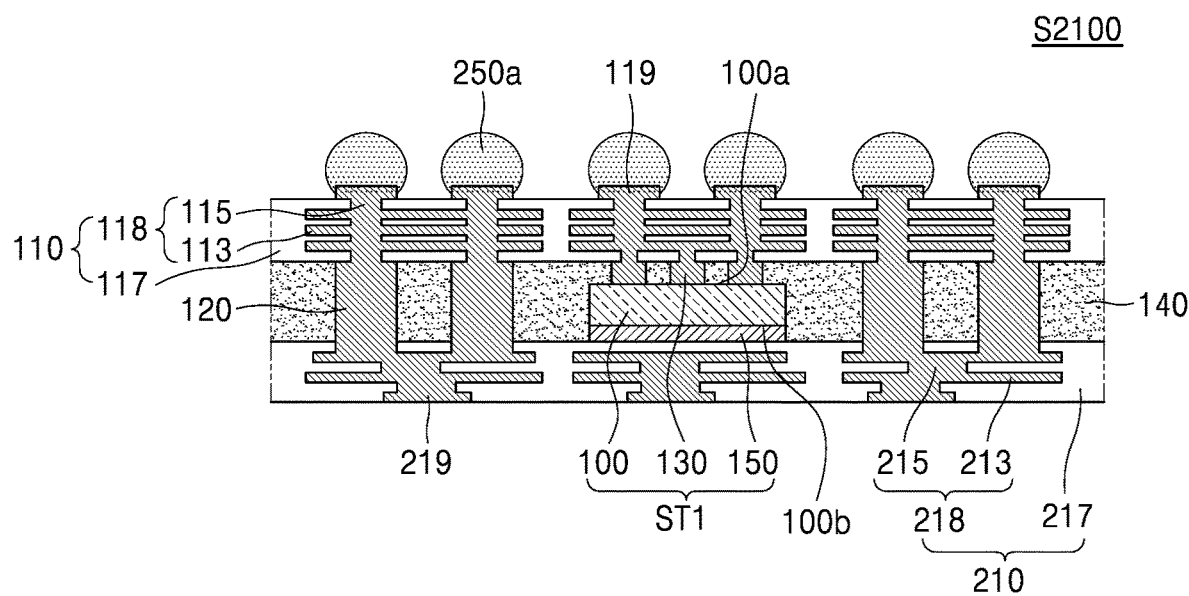

Referring to FIG. 6J, the method of manufacturing the semiconductor package 10 according to one or more embodiments may include operation S2000 of forming the first redistribution structure 110.

In an example embodiment, operation S2000 of forming the first redistribution structure 110 may include forming a first redistribution insulation layer 117 on the molding layer 140 and forming the first redistribution line pattern 113 and the first redistribution via pattern 115 on the first redistribution insulation layer 117.

Because the formation of the first redistribution structure 110 is identical to the formation of the second redistribution structure 210 described above with reference to FIGS. 6B to 6E, detailed descriptions thereof will be omitted.

Additionally, the method of manufacturing the semiconductor package 10 according to one or more embodiments may include forming a first conductive pad 119 on the first redistribution structure 110.

Also, after operation S2000 is performed, an operation of forming the external connection terminal 250a on the first conductive pad 119 may be performed. The external connection terminal 250a may be attached to one surface of the first conductive pad 119.

In an example embodiment, the method of manufacturing the semiconductor package 10 according to one or more embodiments may further include an operation of forming a passive device on the first redistribution structure 110. For example, the operation of forming the passive device may be performed simultaneously with an operation of forming the external connection terminal 250a. However, one or more embodiments are not limited thereto, and the operation of forming the passive device may be performed before or after the operation of forming the external connection terminal 250a.

Referring to FIG. 6L, the method of manufacturing the semiconductor package 10 according to one or more embodiments may include operation S2100 of removing the carrier substrate CS.

By performing the operations of FIGS. 6A to 6K, the manufacturing of the semiconductor package 10 according to one or more embodiments may be completed.

Figure 7:
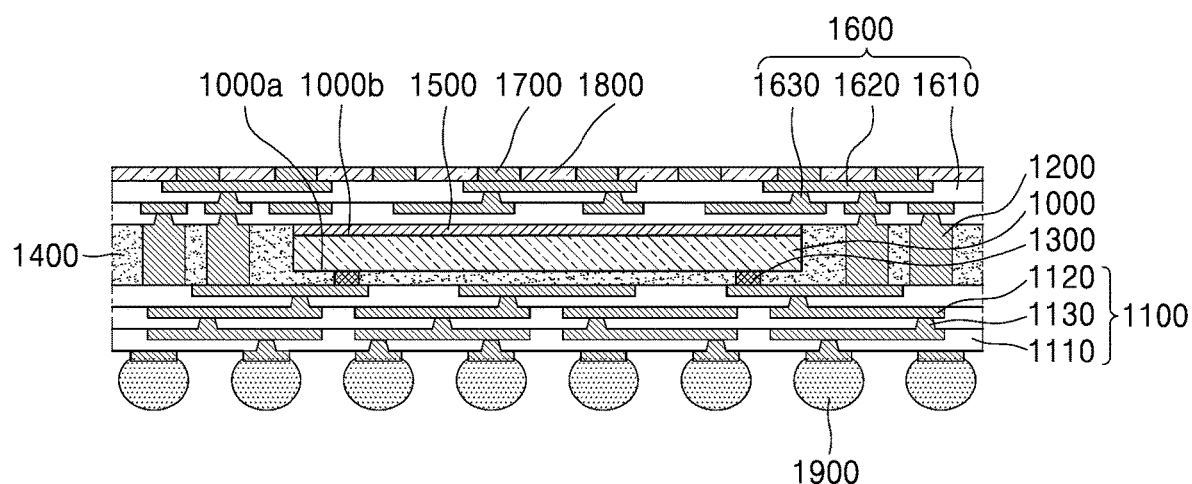
FIG. 7 is a cross-sectional view of a semiconductor package according to one or more embodiments.

FIG. 7 is a cross-sectional view of a semiconductor package 70 according to one or more embodiments.

Referring to FIG. 7, the semiconductor package 70 according to one or more embodiments may include a semiconductor chip 1000, a first redistribution structure 1100, a conductive post 1200, a conductive stud 1300, a first molding layer 1400, an adhesive layer 1500, a second redistribution structure 1600, a conductive pillar 1700, a second molding layer 1800, and an external connection terminal 1900.

In an example embodiment, the first redistribution structure 1100 may include a first redistribution insulation layer 1110 disposed on a first surface 1000a of the semiconductor chip 1000 and a first redistribution line pattern 1120 and a first redistribution via pattern 1130 extending inside the first redistribution insulation layer 1110 and electrically connected to the conductive post 1200 and the conductive stud 1300.

Also, the second redistribution structure 1600 may include a second redistribution insulation layer 1610 disposed on a second surface 1000b of the semiconductor chip 1000 and a second redistribution line pattern 1620 and a second redistribution via pattern 1630 extending inside the second redistribution insulation layer 1610 and electrically connected to the conductive post 1200.

Hereinafter, descriptions of the semiconductor package 70 of FIG. 7 identical to the descriptions of the semiconductor package 10 of FIG. 1 given above will be omitted, and descriptions below will mainly focus on differences therebetween.

The conductive pillar 1700 may be disposed on the second redistribution structure 1600. Also, the conductive pillar 1700 may be electrically connected to the second redistribution line pattern 1620 and the second redistribution via pattern 1630. For example, the conductive pillar 1700 may contact a portion of the second redistribution line pattern 1620.

In an example embodiment, the length of the conductive pillar 1700 in a vertical direction may be less than the length of the conductive post 1200 in the vertical direction. Also, the length of the conductive pillar 1700 in the vertical direction may be greater than the length of the conductive stud 1300 in the vertical direction.

In an example embodiment, the length of the conductive pillar 1700 in the vertical direction may be greater than the length formed by a plurality of second redistribution line patterns 1620 in the vertical direction. Therefore, resistance may be reduced, and electrical characteristics of the semiconductor package 70 may be improved.

In an example embodiment, a material constituting the conductive pillar 1700 may include Cu. However, the material constituting the conductive pillar 1700 is not limited thereto, and the material constituting the conductive posts 120 may include metals like Ni, Au, Ag, Al, W, Ti, Ta, In, Mo, Mn, Co, Sn, Mg, Re, Be, Ga, and Ru, or an alloy thereof.

The second molding layer 1800 may be disposed on the second redistribution structure 1600 and surround side surfaces of the conductive pillar 1700. Also, the second molding layer 1800 may expose one surface of the conductive pillar 1700 to the outside. For example, one surface of the second molding layer 1800 may be on the same plane one surface of the conductive pillar 1700 may.

In an example embodiment, the second molding layer 1800 may include an EMC-based material. However, the material constituting the second molding layer 1800 is not limited to the above-stated EMC and may also include various materials, e.g., an epoxy-based material, a thermosetting material, a thermoplastic material, a UV treatment material, etc.

In an example embodiment, the material constituting the second molding layer 1800 may be substantially the same as the material constituting the first molding layer 1400. Because the first molding layer 1400 and the second molding layer 1800 may include substantially the same material, warpage of a semiconductor package due to a difference between coefficients of thermal expansion (CTE) may be reduced. However, one or more embodiments are not limited thereto, and the material constituting the second molding layer 1800 may be different from the material constituting the first molding layer 1400.

The semiconductor package 70 according to one or more embodiments may include the conductive pillar 1700 disposed on the second redistribution structure 1600, thereby facilitating electrical connection between the semiconductor package 70 and a separate semiconductor package (not shown) mounted on the semiconductor package 70. For example, even when a separate semiconductor package has a redistribution pattern formed in a fine size, the semiconductor package 70 according to one or more embodiments may include the conductive pillar 1700, thereby facilitating electrical connection between the semiconductor package 70 and the separate semiconductor package.

Also, the semiconductor package 70 according to one or more embodiments may include the second molding layer 1800 disposed on the second redistribution structure 1600 and surrounding the conductive pillar 1700, thereby reducing warpage of the semiconductor package 70.

Also, in the semiconductor package 70 according to one or more embodiments, the number of layers formed by first redistribution line patterns 1520 in a horizontal direction may be greater than the number of layers formed by second redistribution line patterns 1620 in the horizontal direction, thereby improving signal integrity (SI) of the semiconductor package 70.

Also, the semiconductor package 70 according to one or more embodiments may include the conductive pillar 1700, thereby improving the heat dissipation efficiency of the semiconductor package 70.

Figure 8:
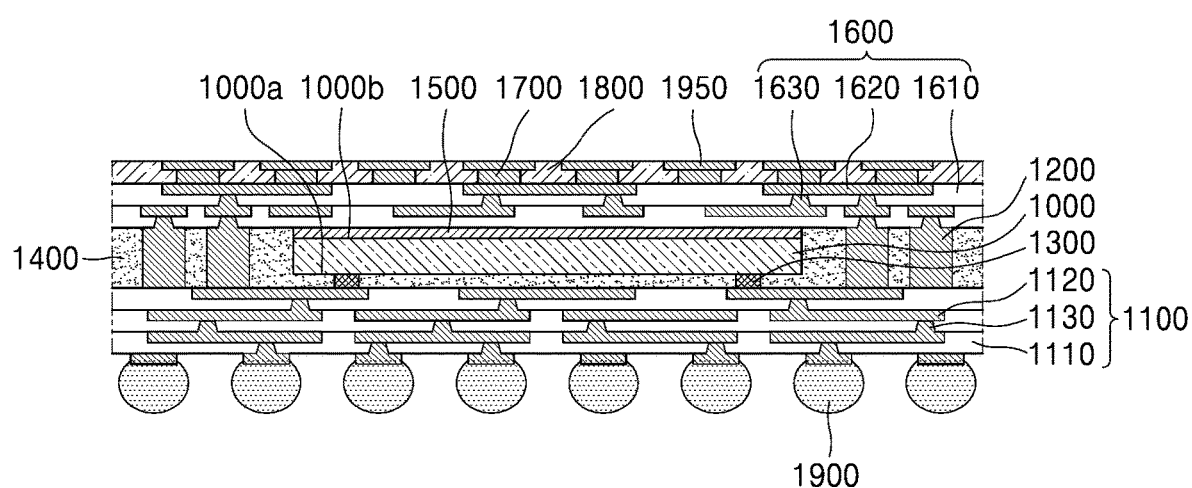
FIG. 8 is a cross-sectional view of a semiconductor package according to one or more embodiments.

FIG. 8 is a cross-sectional view of a semiconductor package 80 according to one or more embodiments.

Referring to FIG. 8, the semiconductor package 80 according to one or more embodiments may include a semiconductor chip 1000, a first redistribution structure 1100, a conductive post 1200, a conductive stud 1300, a first molding layer 1400, an adhesive layer 1500, a second redistribution structure 1600, a conductive pillar 1700, the second molding layer 1800, the external connection terminal 1900, and a package connection pad 1950.

Hereinafter, descriptions of the semiconductor package 80 of FIG. 8 identical to the descriptions of the semiconductor package 70 of FIG. 7 given above will be omitted, and descriptions below will mainly focus on differences therebetween.

The package connection pad 1950 may be a pad mounted on one surface of the conductive pillar 1700 and configured to electrically interconnect the semiconductor package 80 of the present disclosure and a separate semiconductor package (not shown) mounted on the semiconductor package 80.

In an example embodiment, side surfaces of the package connection pad 1950 may be surrounded by the second molding layer 1800. Also, one surface of the package connection pad 1950 may be exposed from the second molding layer 1800. For example, one surface of the package connection pad 1950 may be coplanar with one surface of the second molding layer 1800.

In an example embodiment, the length of the package connection pad 1950 in a horizontal direction may be greater than the length of the conductive pillar 1700 in the horizontal direction.

FIGS. 9A to 9I are diagrams showing operations of the method of manufacturing the semiconductor package 70 according to one or more embodiments, respectively. Hereinafter, a method of manufacturing the semiconductor package 70 according to one or more embodiments will be described in detail with reference to FIGS. 9A to 9I.

Figure 9A:
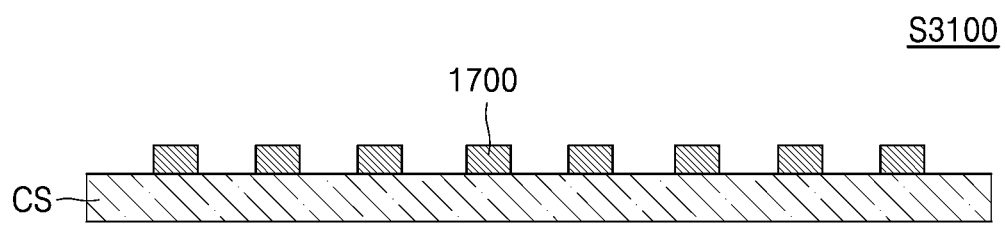
FIGS. 9A to 9I are diagrams showing operations of the method of manufacturing a semiconductor package according to one or more embodiments, respectively.

Referring to FIG. 9A, the method of manufacturing the semiconductor package 70 according to one or more embodiments may include operation S3100 of forming the conductive pillar 1700 on the carrier substrate CS.

In an example embodiment, the carrier substrate CS may include various materials, such as a wafer, a glass substrate, a PCB, an EMC, a GFS, ceramic, epoxy, PI, Basalt, etc. However, the material constituting the carrier substrate CS is not limited thereto.

In an example embodiment, the shape of the carrier substrate CS may be a substrate having a circular or polygonal (e.g., triangular, rectangular, pentagonal, hexagonal, etc.) shape. However, the shape of the carrier substrate CS is not limited thereto. For example, the carrier substrate CS may be a circular plate or a polygonal plate having a width from 200 mm to 600 mm.

In an example embodiment, the conductive pillar 1700 may be formed on the carrier substrate CS through a photolithography process, an etching process, a plating process, etc. For example, the conductive pillar 1700 may be formed by using a metal plating method.

However, one or more embodiments are not limited thereto, and the conductive pillar 1700 may be formed by using a wire bonding method. For example, the conductive pillar 1700 may be formed through a process of placing a wire including a conductive material on the carrier substrate CS in a vertical direction.

However, the method of forming the conductive pillar 1700 is not limited thereto, and the conductive pillar 1700 may be formed by using various methods.

Figure 9B:
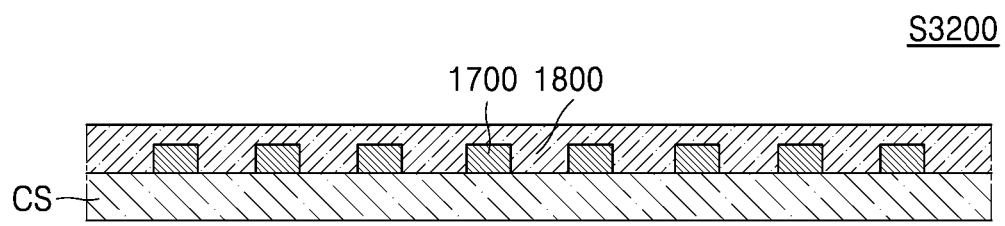

Referring to FIG. 9B, the method of manufacturing the semiconductor package 70 according to one or more embodiments may include operation S3200 of forming the second molding layer 1800 on the carrier substrate CS.

In an example embodiment, the second molding layer 1800 may cover side surfaces and the top surface of the conductive pillar 1700 on the carrier substrate CS.

Figure 9C:
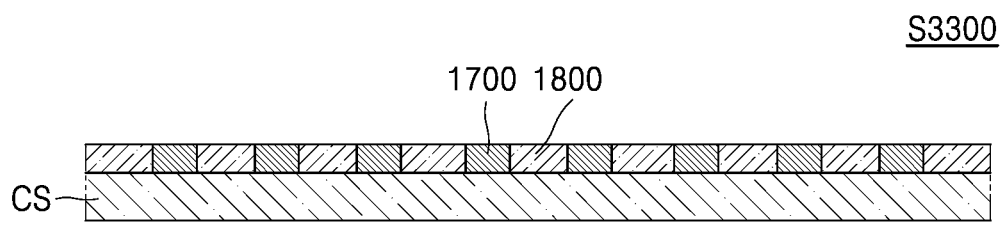

Referring to FIG. 9C, the method of manufacturing the semiconductor package 70 according to one or more embodiments may include operation S3300 of removing at least a portion of the second molding layer 1800 so that one surface of the conductive pillar 1700 is exposed.

Figure 9D:
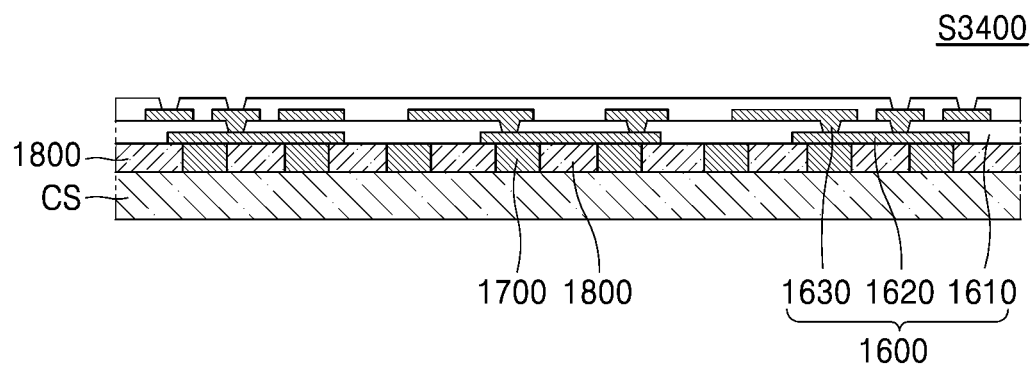

Referring to FIG. 9D, the method of manufacturing the semiconductor package 70 according to one or more embodiments may include operation S3400 of forming the second redistribution structure 1600 on the second molding layer 1800.

In an example embodiment, operation S3400 may include forming the second redistribution insulation layer 1610 on the second molding layer 1800 and forming the second redistribution line pattern 1620 and the second redistribution via pattern 1630 on the second redistribution insulation layer 1610.

In an example embodiment, the formation of the second redistribution line pattern 1620 and the second redistribution via pattern 1630 on the second redistribution insulation layer 1610 may be performed through a photolithography process, an etching process, a plating process, etc.

In an example embodiment, a portion of the second redistribution line pattern 1620 may contact the conductive pillar 1700. Therefore, the conductive pillar 1700 may be electrically connected to the second redistribution line pattern 1620 and the second redistribution via pattern 1630 of the second redistribution structure 1600.

Figure 9E:
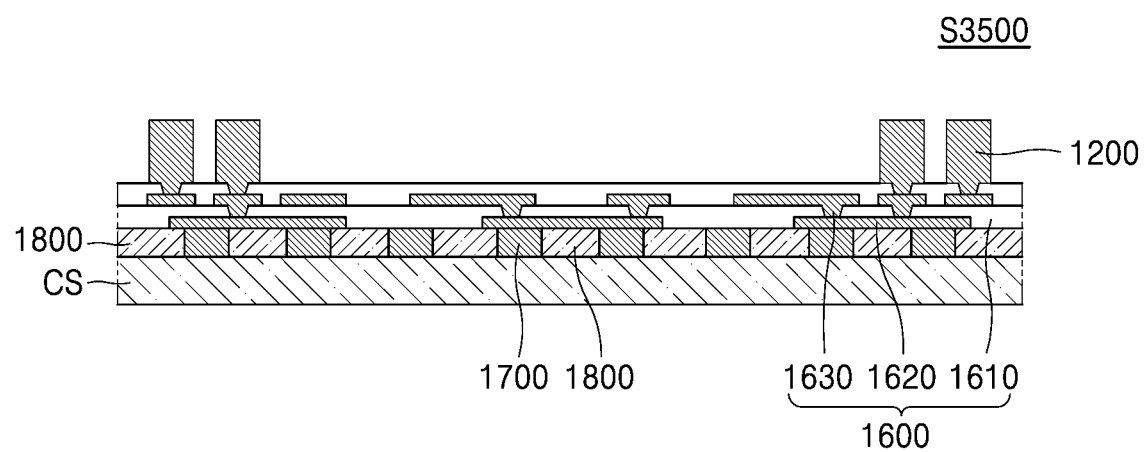

Referring to FIG. 9E, the method of manufacturing the semiconductor package 70 according to one or more embodiments may include operation S3500 of forming the conductive post 1200 on the second redistribution structure 1600.

In an example embodiment, the conductive post 1200 may be electrically connected to the second redistribution line pattern 1620 and the second redistribution via pattern 1630. Also, at least a portion of the conductive post 1200 may be surrounded by the second redistribution insulation layer 1610.

Figure 9F:
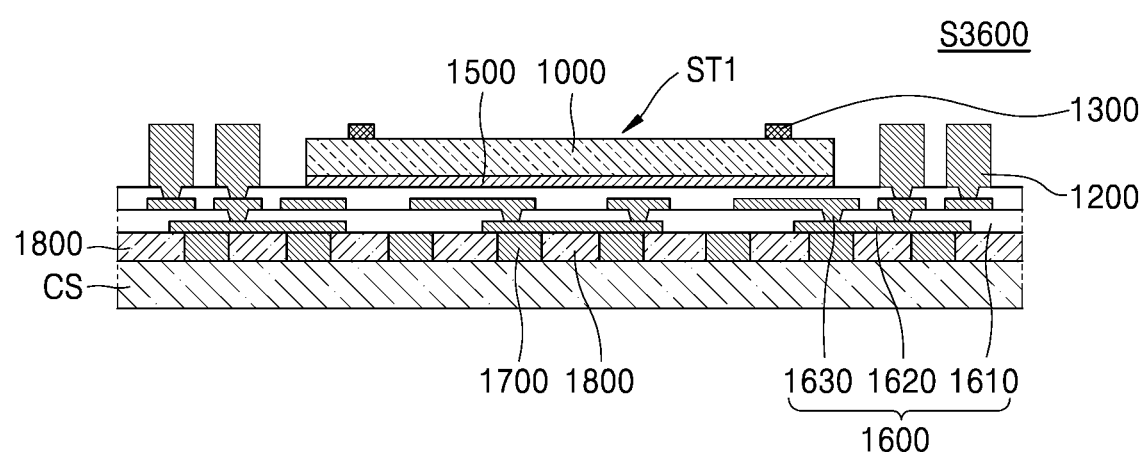

Referring to FIG. 9F, the method of manufacturing a semiconductor package 70 according to one or more embodiments may include operation S3600 of mounting the semiconductor structure ST1, in which the adhesive layer 1500, the semiconductor chip 1000, and the conductive stud 1300 are sequentially stacked, on the second redistribution structure 1600.

In an example embodiment, the semiconductor chip 1000 may be attached on the second redistribution structure 1600 through the adhesive layer 1500. Also, the first semiconductor structure ST1 may be disposed between conductive posts 1200.

In an example embodiment, after operation S3600 is performed, at least a portion of the carrier substrate CS may be removed, such that the carrier substrate CS has a certain vertical length. For example, at least a portion of the carrier substrate CS may be ground.

Also, after at least a portion of the carrier substrate CS is ground, the structure of operation S3600 may be individualized. Also, before performing operation S3700, the individualized structure of operation S3600 may be arranged on a separate carrier substrate (not shown). Also, the individualized structure of operation S3600 arranged on the separate carrier substrate (not shown) may be molded by the first molding layer 1400 by performing operation S3700.

Figure 9G:
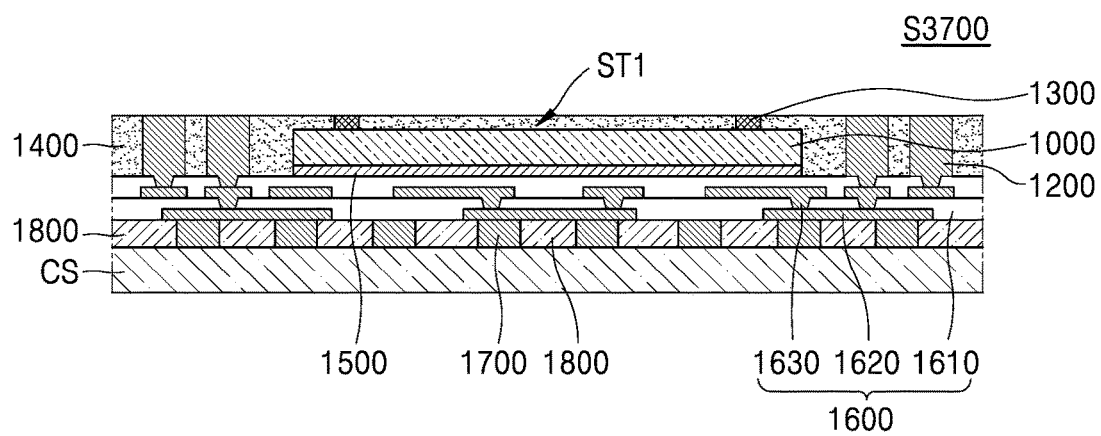

Referring to FIG. 9G, the method of manufacturing the semiconductor package 70 according to one or more embodiments may include operation S3700 of forming the first molding layer 1400 on the second redistribution structure 1600.

In an example embodiment, operation S3700 may include forming the first molding layer 1400 on the second redistribution structure 1600 to surround the conductive post 1200 and the first semiconductor structure ST1 and removing at least a portion of the first molding layer 1400, such that one surface of the conductive post 1200 is on the same plane as one surface of the conductive stud 1300 of the first semiconductor structure ST1

Figure 9H:
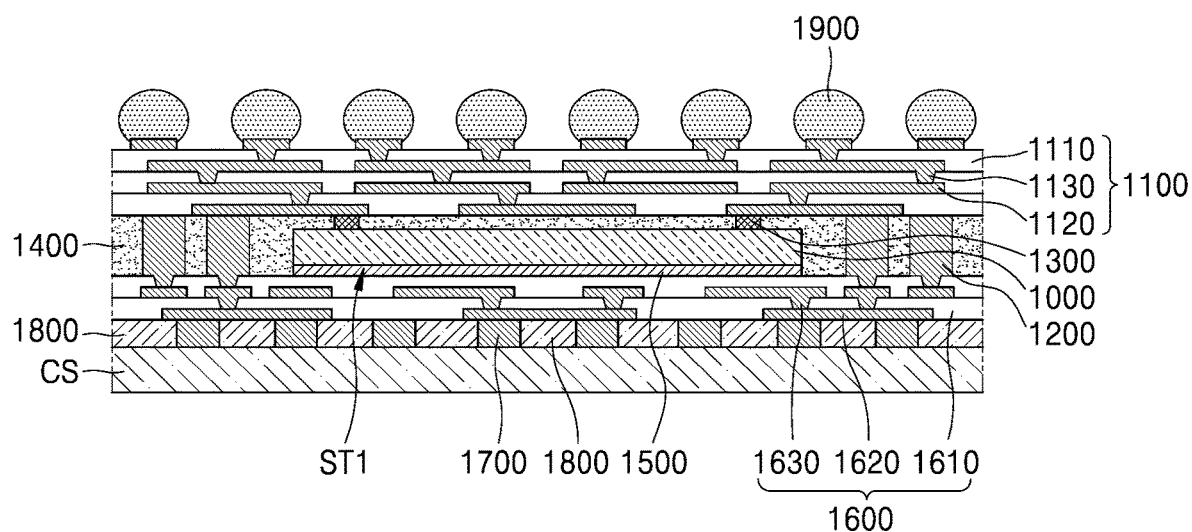

Referring to FIG. 9H, the method of manufacturing the semiconductor package 70 according to one or more embodiments may include operation S3800 of forming the first redistribution structure 1100 on the first molding layer 1400.

In an example embodiment, operation S8400 may include forming the first redistribution insulation layer 1110 on the first molding layer 1400 and forming the first redistribution line pattern 1120 and the first redistribution via pattern 1130 on the first redistribution insulation layer 1110.

In an example embodiment, the formation of the first redistribution line pattern 1120 and the first redistribution via pattern 1130 on the first redistribution insulation layer 1110 may be performed through a photolithography process, an etching process, a plating process, etc.

In an example embodiment, after operation S3800 is performed, an operation of forming the external connection terminal 1900 on the first redistribution structure 1100 may be additionally performed. For example, the external connection terminal 1900 may be electrically connected to the first redistribution line pattern 1120 and the first redistribution via pattern 1130 of the first redistribution structure 1100.

In an example embodiment, the method of manufacturing the semiconductor package 70 according to one or more embodiments may further include an operation of forming a passive device on the first redistribution structure 1100. For example, the operation of forming the passive device may be performed simultaneously with an operation of forming the external connection terminal 1900. However, one or more embodiments are not limited thereto, and the operation of forming the passive device may be performed before or after the operation of forming the external connection terminal 1900.

Figure 9I:
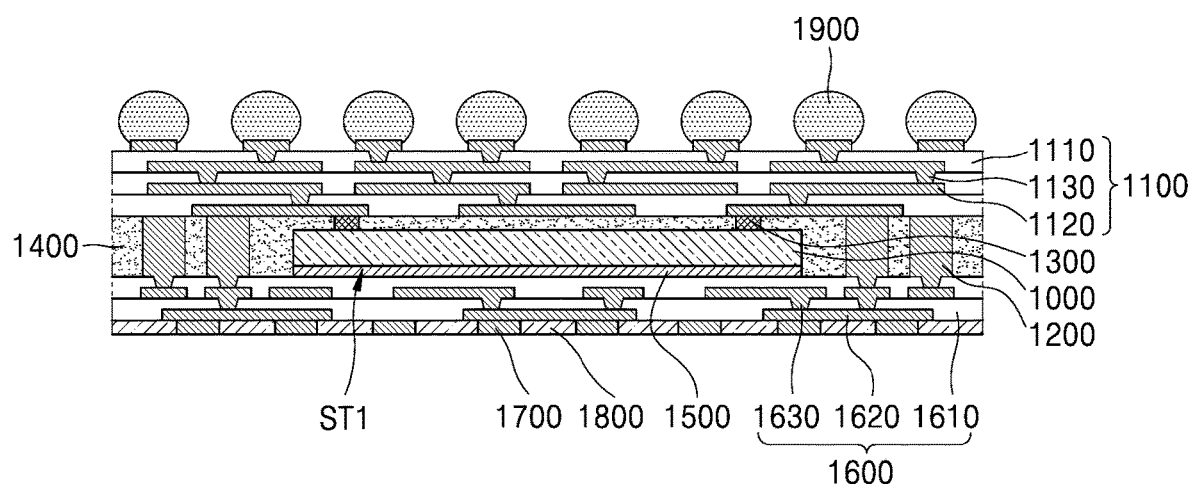

Referring to FIG. 9I, the method of manufacturing the semiconductor package 70 according to one or more embodiments may include operation S3900 of removing the carrier substrate CS.

In an example embodiment, when the carrier substrate CS is removed, one surface of the second molding layer 1800 and one surface of the conductive pillar 1700 may be arranged on the same plane.

Figure 10A:
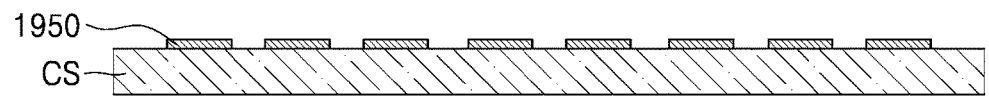
FIGS. 10A and 10B are diagrams showing some of operations of a method of manufacturing the semiconductor package according to one or more embodiments.
Figure 10B:
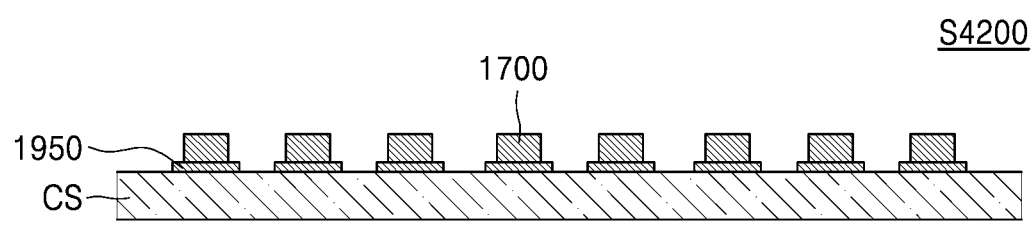

FIGS. 10A and 10B are diagrams showing some of operations of a method of manufacturing the semiconductor package according to one or more embodiments. In detail, a method of manufacturing a semiconductor package 80 according to according to one or more embodiments may be a method of manufacturing the semiconductor package 80 of FIG. 8.

Referring to FIG. 10A, the method of manufacturing the semiconductor package 80 according to one or more embodiments may include operation S4100 of forming the package connection pad 1950 on the carrier substrate CS.

Referring to FIG. 10B, the method of manufacturing the semiconductor package 80 according to one or more embodiments may include operation S4200 of forming the conductive pillar 1700 on the package connection pad 1950.

In an example embodiment, after operation S4200 is performed, the operations described above with reference to FIGS. 9B to 9I may be performed. Therefore, the manufacturing of the semiconductor package 80 described above with reference to FIG. 8 may be completed.

Figure 11:
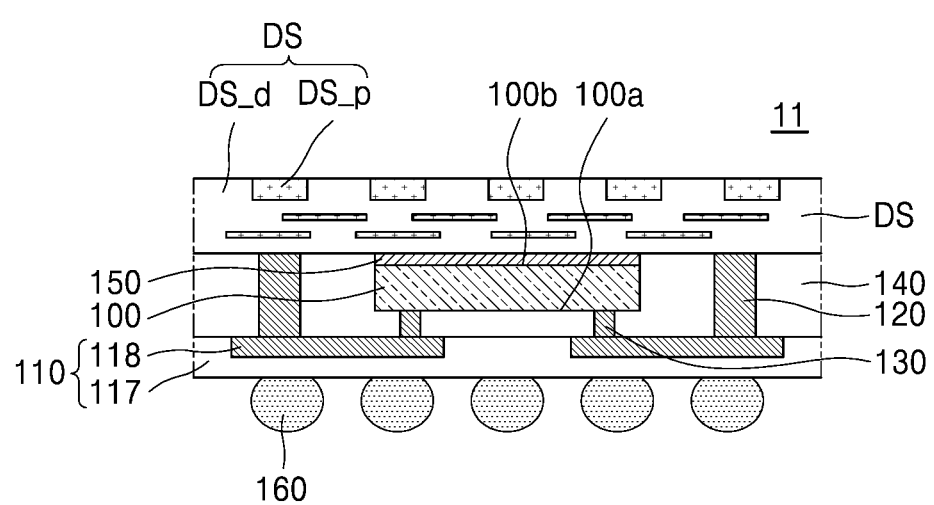
FIG. 11 is a cross-sectional view of a semiconductor package according to one or more embodiments.

FIG. 11 is a cross-sectional view of a semiconductor package 11 according to one or more embodiments.

The semiconductor package 11 according to one or more embodiments may include the semiconductor chip 100, the first redistribution structure 110 including the first redistribution insulation layer 117 and the first redistribution pattern 118, the conductive post 120, the conductive stud 130, the molding layer 140, and a distribution substrate DS.

Hereinafter, descriptions of the semiconductor package 11 of FIG. 11 identical to the descriptions of the semiconductor package 10 of FIG. 1 given above will be omitted, and descriptions below will mainly focus on differences therebetween.

In an example embodiment, the distribution substrate DS may be disposed on the second surface 100b of the semiconductor chip 100. In detail, the distribution substrate DS may be disposed on the adhesive layer 150 and the molding layer 140.

In an example embodiment, the distribution substrate DS may include a PCB. Specifically, the distribution substrate DS may be a PCB including a circuit pattern DS_p and a distribution insulation layer DS_d surrounding the circuit pattern DS_p.

In an example embodiment, the distribution substrate DS may contact the conductive post 120. In detail, the circuit pattern DS_p of the distribution substrate DS may contact the conductive post 120 and be electrically connected thereto.

In an example embodiment, one surface of the distribution substrate DS may be coplanar with one surface of the conductive post 120, one surface of the adhesive layer 150, and one surface of the molding layer 140.

The semiconductor package 80 according to one or more embodiments may include the distribution substrate DS disposed on the second surface 100b of the semiconductor chip 100 and connected to the conductive post 120, thereby facilitating electrical connection between the semiconductor package 80 and a separate semiconductor package (not shown) mounted on the semiconductor package 80.

FIGS. 12A to 12D are diagrams showing operations of the method of manufacturing the semiconductor package 11 according to one or more embodiments, respectively.

Hereinafter, a method of manufacturing the semiconductor package 11 according to one or more embodiments will be described with reference to FIGS. 12A to 12D. In detail, a method of manufacturing a semiconductor package according to according to one or more embodiments may be a method of manufacturing the semiconductor package 11 of FIG. 11.

Figure 12A:
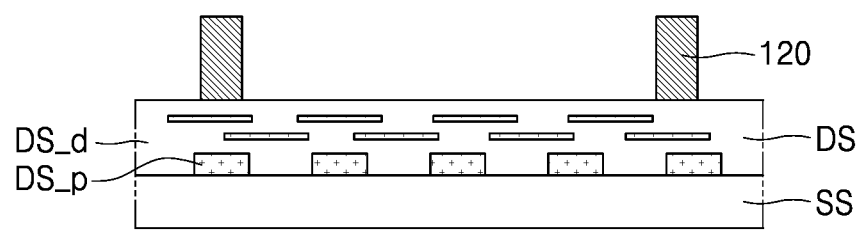
FIGS. 12A to 12D are diagrams showing operations of the method of manufacturing the semiconductor package according to one or more embodiments, respectively.

Referring to FIG. 12A, the method of manufacturing the semiconductor package 11 according to one or more embodiments may include operation S5100 of forming the conductive posts 120 on the distribution substrate DS.

Before operation S5100 is performed, a support substrate SS may be attached to the bottom of the distribution substrate DS. For example, the support substrate SS may include a silicon substrate or a glass fiber substrate. However, operation S5100 may be performed while the support substrate SS is omitted.

In an example embodiment, the conductive post 120 may be mounted on the distribution substrate DS and may be electrically connected to the circuit pattern DS_p.

Figure 12B:
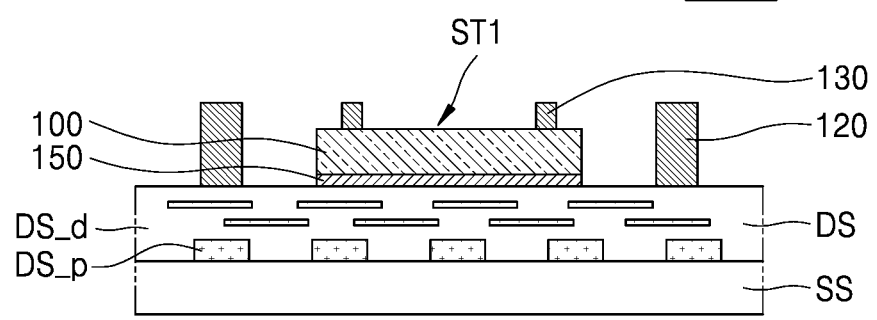

Referring to FIG. 12B, the method of manufacturing the semiconductor package 11 according to one or more embodiments may include operation S5200 of mounting the first semiconductor structure ST1, in which the adhesive layer 150, the semiconductor chip 100, and the conductive stud 130 are sequentially stacked, on the distribution substrate DS.

In an example embodiment, the semiconductor chip 100 may be attached to the distribution substrate DS through the adhesive layer 150. Also, the first semiconductor structure ST1 may be disposed between conductive posts 120.

Figure 12C:
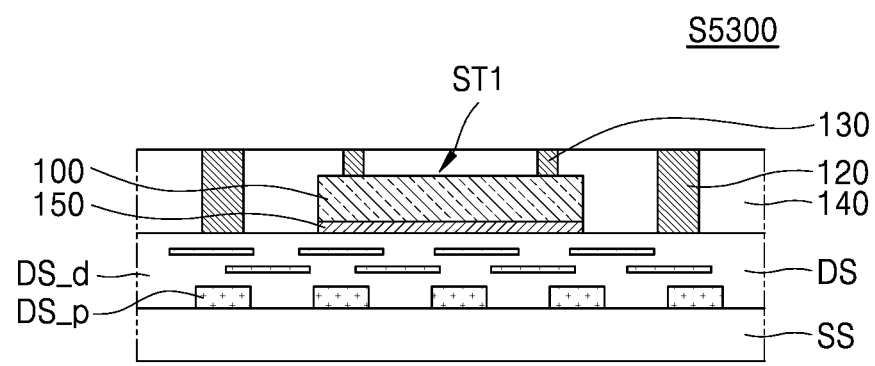

Referring to FIG. 12C, the method of manufacturing the semiconductor package 11 according to one or more embodiments may include operation S5300 of forming the molding layer 140 on the distribution substrate DS.

In an example embodiment, operation S5300 may include forming the molding layer 1400 on the distribution substrate DS to surround the conductive post 120 and the first semiconductor structure ST1 and removing at least a portion of the molding layer 140, such that one surface of the conductive post 120 is on the same plane as one surface of the conductive stud 130 of the first semiconductor structure ST1

Figure 12D:
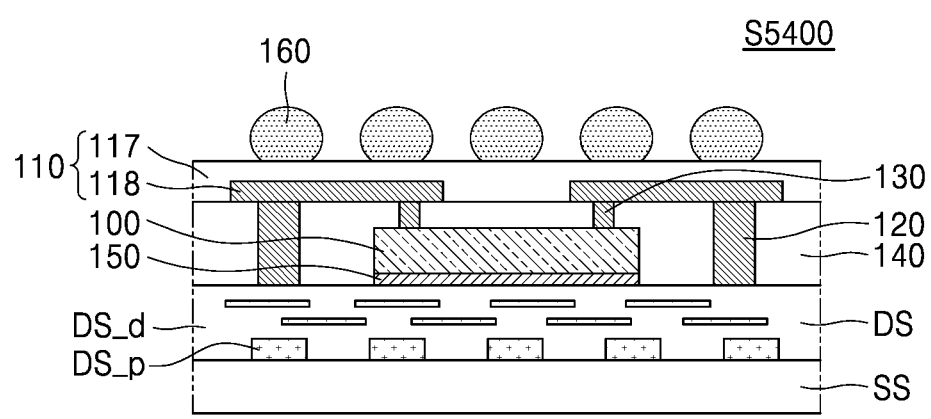

Referring to FIG. 12D, the method of manufacturing the semiconductor package 11 according to one or more embodiments may include operation S5400 of forming the first redistribution structure 110 on the molding layer 140.

In an example embodiment, operation S5400 may include forming the first redistribution insulation layer 117 on the molding layer 140 and forming the first redistribution pattern 118 on the first redistribution insulation layer 117.

In an example embodiment, the formation of the first redistribution pattern 118 on the first redistribution insulation layer 117 may be performed through a photolithography process, an etching process, a plating process, etc.

In an example embodiment, after the first redistribution structure 110 is formed, an operation of forming an external connection terminal 160 on the first redistribution structure 110 may be additionally performed. For example, the external connection terminal 160 may be electrically connected to the first redistribution pattern 118 of the first redistribution structure 110.

Also, after operation S5400 is performed, an operation of removing the support substrate SS may be performed. The manufacturing of the semiconductor package 11 according to one or more embodiments may be completed by the operation described above with reference to FIGS. 12A to 12D.

Figure 13:
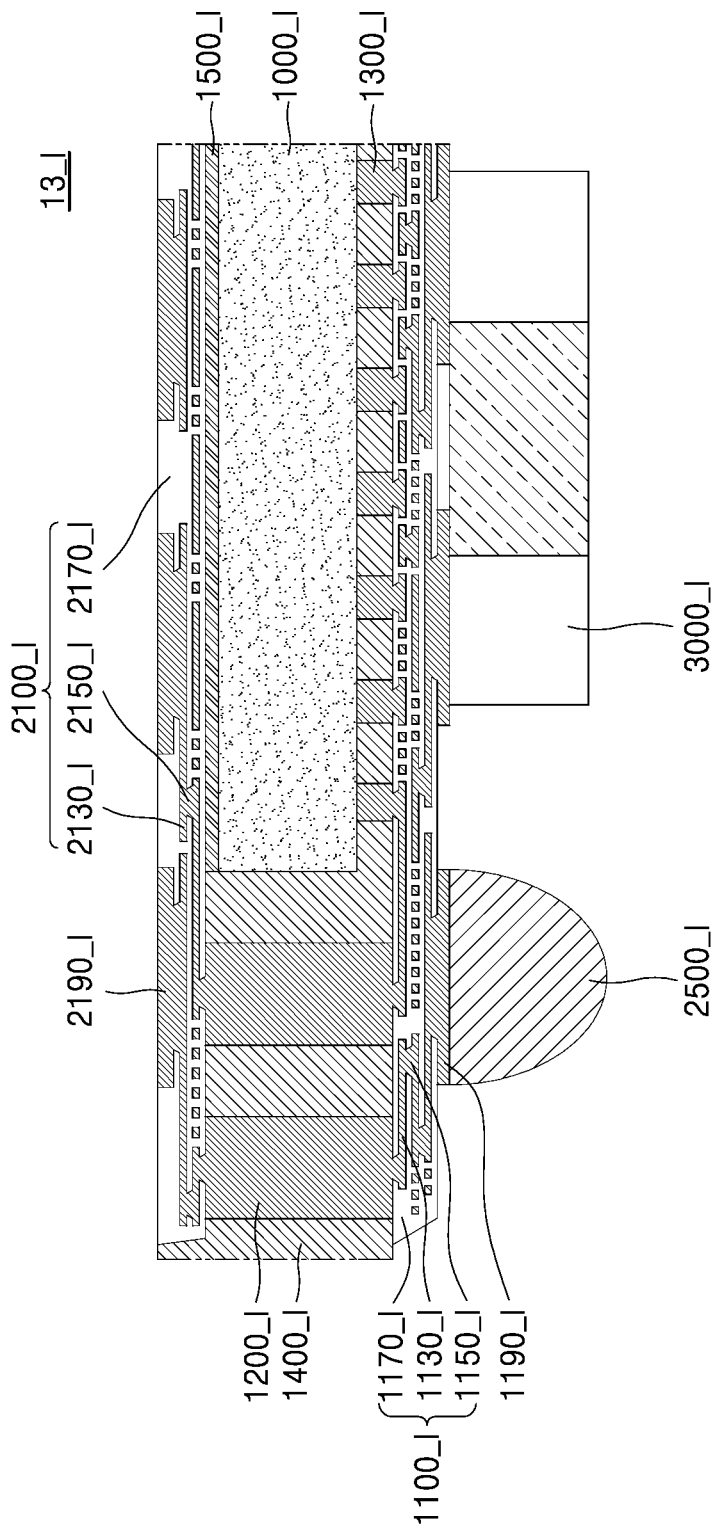
FIG. 13 is a cross-sectional view of a semiconductor package according to one or more embodiments.

FIG. 13 is a cross-sectional view of a semiconductor package 13_I according to one or more embodiments.

Referring to FIG. 13, the semiconductor package 13_I according to one or more embodiments may include a semiconductor chip 1000_I, a first redistribution structure 1100_I, a conductive post 1200_I, a conductive stud 1300_I, a molding layer 1400_I, an adhesive layer 1500_I, a second redistribution structure 2100_I, an external connection terminal 2500_I, and a passive device 3000_I.

Hereinafter, descriptions of the semiconductor package 13_I of FIG. 13 identical to the descriptions of the semiconductor package 10 of FIG. 1 given above will be omitted, and descriptions below will mainly focus on differences therebetween.

The passive device 3000_I may be disposed under the first redistribution structure 1100_I. For example, the passive device 3000_I may be mounted on a first conductive pad 1190_I to be electrically connected to the first redistribution line pattern 1130_I and the first redistribution via pattern 1150_I.

In an example embodiment, the passive device 3000_I may be electrically connected to the semiconductor chip 1000_I. Also, the passive device 3000_I may perform the function of a at least any one of a capacitor, an inductor, and a resistor.

In an example embodiment, sidewalls of the first redistribution structure 1100_I may be formed to be inclined with respect to sidewalls of the molding layer 1400_I. In other words, the sidewalls of the first redistribution structure 1100_I may not be arranged on the same planes as the sidewalls of the molding layer 1400_I.

For example, the first redistribution structure 1100_I may have a tapered structure in which the cross-sectional area in a horizontal direction decreases toward the external connection terminal 2500_I. In other words, the first redistribution structure 1100_I may have a tapered structure in which the cross-sectional area in the horizontal direction decreases in a vertical direction away from the semiconductor chip 1000_I.

For example, in an individualization process (e.g., a sawing process) of the semiconductor package 13_I, a portion of the first redistribution structure 1100_I is removed, and thus the first redistribution structure 1100_I may have the tapered shape as described above.

In an example embodiment, in the cross-section of the first redistribution structure 1100_I, a first vertex formed as the top surface and a side surface of the first redistribution structure 1100_I meets may be at a position inside that of a second vertex formed as the top surface and a side surface of the first redistribution structure 1100_I meets.

The top surface of the first redistribution structure 1100_I may be one surface of the first redistribution structure 1100_I adjacent to the molding layer 1400_I, and the bottom surface of the first redistribution structure 1100_I may be one surface of the first redistribution structure 1100_I adjacent to the external connection terminal 2500_I of the first redistribution structure 1100_I.

In an example embodiment, sidewalls of the first redistribution structure 1100_I and sidewalls of the molding layer 1400_I may be on the same planes.

In an example embodiment, the molding layer 1400_I may surround side surfaces of the second redistribution structure 2100_I. In other words, the sidewalls of the second redistribution structure 2100_I may be closer to the semiconductor chip 1000_I than the sidewalls of the molding layer 1400_I. Also, the sidewalls of the second redistribution structure 2100_I may not be exposed to the outside.

In an example embodiment, the length of a first molding portion disposed between the top surface of the first redistribution structure 1100_I and the bottom surface of the second redistribution structure 2100_I in a vertical direction may be less than the length of a second molding portion disposed on the top surface of the first redistribution structure 1100_I and surround the side surfaces of the second redistribution structure 2100_I.

In an example embodiment, the method of manufacturing the semiconductor package 13_I of FIG. 13 may be manufactured by using the structure shown in FIG. 6G.

In an example embodiment, the second redistribution structure 210 of FIG. 6G may correspond to the second redistribution structure 2100_I of FIG. 13. A plurality of structures of FIG. 6G may be provided, and the plurality of structures of FIG. 6G may be arranged on a carrier substrate (not shown).

The carrier substrate may include various materials, such as a wafer, a glass substrate, a PCB, an EMC, a GFS, ceramic, epoxy, PI, Basalt, etc. However, the material constituting the carrier substrate is not limited thereto. In an example embodiment, the shape of the carrier substrate may be a substrate having a circular or polygonal (e.g., triangular, rectangular, pentagonal, hexagonal, etc.) shape. However, the shape of the carrier substrate is not limited thereto. For example, the carrier substrate may be a circular plate or a polygonal plate having a width from 200 mm to 600 mm.

In an example embodiment, after the structures of FIG. 6G are arranged on the carrier substrate (not shown), at least a portion of the carrier substrate may be ground, such that the carrier substrate has a certain thickness. However, the above-stated process of grinding the carrier substrate may be omitted.

In a state in which the structures of FIG. 6G are arranged on the carrier substrate, the molding layer 1400_I of FIG. 13 may surround the structures of FIG. 6G on the carrier substrate. In this case, the molding layer 1400_I may surround the side surfaces of the second redistribution structure 2100_I. The technical spirit of one or more embodiments described above is not limited to the above-described embodiments and the accompanying drawings. Also, it would be obvious to one of ordinary skill in the art to which one or more embodiments belong that various substitutions, modifications, and changes may be made without departing from the technical spirit of one or more embodiments.

The invention claimed is:

1. A semiconductor package comprising:
a semiconductor chip having a first surface adjacent to an active layer and a second surface opposite to the first surface;
a conductive stud disposed on the first surface of the semiconductor chip and connected to the active layer;
an adhesive layer disposed on the second surface of the semiconductor chip;
a conductive post disposed outside the semiconductor chip;
a first redistribution structure, which is on the first surface of the semiconductor chip and comprises a first redistribution insulation layer supporting the conductive stud and the conductive post; a first redistribution line pattern extending inside the first redistribution insulation layer in a horizontal direction; and a first redistribution via pattern extending inside the first redistribution insulation layer in a vertical direction;
a second redistribution structure, which is on the second surface of the semiconductor chip and comprises a second redistribution insulation layer disposed on the adhesive layer; a second redistribution line pattern extending inside the second redistribution insulation layer in a horizontal direction; and a second redistribution via pattern extending inside the second redistribution insulation layer in a vertical direction;
a first molding layer disposed on the first redistribution structure and surrounding the semiconductor chip, the adhesive layer, the conductive stud, and the conductive post,
a conductive pillar disposed on the second redistribution structure and connected to the second redistribution line pattern and the second redistribution via pattern of the second redistribution structure; and
a second molding layer disposed on the second redistribution structure and surrounding a side surface of the conductive pillar,
wherein the side surface of the conductive pillar is entirely covered with the second molding layer.

2. The semiconductor package of claim 1,
wherein the conductive post penetrates through the first molding layer in the vertical direction, and
the second redistribution insulation layer of the second redistribution structure surrounds at least a portion of the conductive post.

3. The semiconductor package of claim 1,
wherein a number of layers formed by the first redistribution line pattern of the first redistribution structure in the horizontal direction is
greater than a number of layers formed by the second redistribution line pattern of the second redistribution structure in the horizontal direction.

4. The semiconductor package of claim 1,
wherein one surface of the conductive post contacts the first redistribution via pattern of the first redistribution structure, and
the other surface of the conductive post opposite to the one surface contacts the second redistribution line pattern of the second redistribution structure.

5. The semiconductor package of claim 1, wherein a thickness of the second molding layer is the same as a thickness of the conductive pillar.

6. The semiconductor package of claim 1, wherein one surface of the second molding layer is on the same plane as one surface of the conductive pillar.

7. A semiconductor package comprising:
a semiconductor chip having a first surface adjacent to an active layer and a second surface opposite to the first surface;
a conductive stud disposed on the first surface of the semiconductor chip and connected to the active layer;
an adhesive layer disposed on the second surface of the semiconductor chip;
a conductive post disposed outside the semiconductor chip;
a first redistribution structure, which is on the first surface of the semiconductor chip and comprises a first redistribution insulation layer supporting the conductive stud and the conductive post; a first redistribution line pattern extending inside the first redistribution insulation layer in a horizontal direction; and a first redistribution via pattern extending inside the first redistribution insulation layer in a vertical direction;
a second redistribution structure, which is on the second surface of the semiconductor chip and comprises a second redistribution insulation layer disposed on the adhesive layer; a second redistribution line pattern extending inside the second redistribution insulation layer in a horizontal direction; and a second redistribution via pattern extending inside the second redistribution insulation layer in a vertical direction;
a first molding layer disposed on the first redistribution structure and surrounding the semiconductor chip, the adhesive layer, the conductive stud, and the conductive post,
a conductive pillar disposed on the second redistribution structure and connected to the second redistribution line pattern and the second redistribution via pattern of the second redistribution structure;
a second molding layer disposed on the second redistribution structure and surrounding a side surface of the conductive pillar; and
a package connection pad disposed on the conductive pillar,
wherein the second molding layer surrounds side surfaces of the package connection pad, and
one surface of the second molding layer is on the same plane as one surface of the package connection pad.

8. The semiconductor package of claim 1, wherein a first vertex formed by connecting bottom and side surfaces of the first redistribution structure is disposed inside a second vertex formed by connecting top and side surfaces of the first redistribution structure.

9. The semiconductor package of claim 1, wherein sidewalls of the second redistribution structure are surrounded by the first molding layer.

10. The semiconductor package of claim 9, wherein a length of a first molding portion of the molding layer disposed between a top surface of the first redistribution structure and a bottom surface of the second redistribution structure in the vertical direction is less than a length of a second molding portion disposed on the top surface of the first redistribution structure and surrounding side surfaces of the second redistribution structure in the vertical direction.

11. The semiconductor package of claim 1, further comprising
a passive device disposed on the first redistribution structure.

12. The semiconductor package of claim 1, wherein the second redistribution structure comprises a printed circuit board (PCB).

* * * * *